United States Patent
Gong et al.

(10) Patent No.: US 9,605,099 B2
(45) Date of Patent: Mar. 28, 2017

(54) OLEFIN RESIN

(71) Applicant: LG CHEM, LTD., Seoul (KR)

(72) Inventors: Jin Sam Gong, Daejeon (KR); Choong Hoon Lee, Daejeon (KR); Sung Ho Choi, Daejeon (KR); Ji Yoon Woo, Daejeon (KR); Hyo Ju Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/033,233

(22) PCT Filed: Oct. 30, 2014

(86) PCT No.: PCT/KR2014/010307
§ 371 (c)(1),
(2) Date: Apr. 29, 2016

(87) PCT Pub. No.: WO2015/065069
PCT Pub. Date: May 7, 2015

(65) Prior Publication Data
US 2016/0289358 A1    Oct. 6, 2016

(30) Foreign Application Priority Data

Oct. 30, 2013   (KR) .................. 10-2013-0130503
Jan. 29, 2014   (KR) .................. 10-2014-0011161
(Continued)

(51) Int. Cl.
*C08F 210/16*   (2006.01)
*C08L 23/00*    (2006.01)
(Continued)

(52) U.S. Cl.
CPC ............ *C08F 210/16* (2013.01); *C08F 10/00* (2013.01); *C08J 5/18* (2013.01); *C08L 23/00* (2013.01);
(Continued)

(58) Field of Classification Search
None
See application file for complete search history.

(56) References Cited

U.S. PATENT DOCUMENTS 6,420,507 B1 * 7/2002 Kale ................. C07F 17/00
                                                502/152
8,609,231 B2 * 12/2013 Wu .................. B32B 17/10
                                                428/215
(Continued)

FOREIGN PATENT DOCUMENTS

JP   2001-002863 A   1/2001
JP   2011-089140 A   5/2011
(Continued)

OTHER PUBLICATIONS

International Search Report (PCT/ISA/210) issued in PCT/KR2014/010307, mailed on Jan. 27, 2015.
(Continued)

*Primary Examiner* — Robert S Loewe
(74) *Attorney, Agent, or Firm* — Birch, Stewart, Kolasch & Birch, LLP

(57) ABSTRACT

Provided are a polyolefin resin having two crystallization temperatures, a resin composition including the polyolefin resin, an encapsulant film, a method for manufacturing the encapsulant for an optoelectronic device, and an optoelectronic device, in which the encapsulant having high light transmittance and low haze value can be provided even under the condition of low lamination, and the resin composition including the polyolefin resin can be used for manufacturing various encapsulants for an optoelectronic device, thereby providing excellent adhesive strength with the front substrate and back sheet included in the device, especially, a long-term adhesion property and improved heat resistance.

19 Claims, 5 Drawing Sheets

(30) Foreign Application Priority Data

| | | |
|---|---|---|
| Jan. 29, 2014 | (KR) | 10-2014-0011164 |
| Oct. 30, 2014 | (KR) | 10-2014-0149266 |
| Oct. 30, 2014 | (KR) | 10-2014-0149267 |
| Oct. 30, 2014 | (KR) | 10-2014-0149268 |

(51) Int. Cl.
  *C08F 10/00* (2006.01)
  *C08J 5/18* (2006.01)
  *H01L 31/0203* (2014.01)
  *H01L 33/56* (2010.01)
  *H01L 51/52* (2006.01)

(52) U.S. Cl.
  CPC ....... *H01L 31/0203* (2013.01); *C08J 2323/20* (2013.01); *H01L 33/56* (2013.01); *H01L 51/5237* (2013.01)

(56) References Cited

U.S. PATENT DOCUMENTS

| | | | | |
|---|---|---|---|---|
| 2006/0199914 A1* | 9/2006 | Harris | | C08F 210/16 525/242 |
| 2007/0021561 A1* | 1/2007 | Tse | | C08L 23/10 525/88 |
| 2008/0038533 A1* | 2/2008 | Best | | B32B 27/32 428/220 |
| 2008/0167421 A1* | 7/2008 | Yalvac | | C08F 255/02 524/570 |
| 2008/0306217 A1* | 12/2008 | Karjala | | C08F 10/00 525/207 |
| 2010/0160497 A1* | 6/2010 | Karjala | | C08F 8/00 524/13 |
| 2013/0085246 A1 | 4/2013 | Kum et al. | | |
| 2013/0087198 A1 | 4/2013 | Naumovitz et al. | | |
| 2013/0137833 A1 | 5/2013 | Amamiya et al. | | |
| 2013/0167909 A1* | 7/2013 | Amamiya | | C08L 23/0815 136/251 |
| 2014/0357780 A1* | 12/2014 | Rasal | | C09J 123/0807 524/528 |
| 2015/0065638 A1* | 3/2015 | Lipishan | | C09J 153/00 524/505 |
| 2015/0148490 A1* | 5/2015 | Kapur | | C07F 7/184 525/240 |
| 2016/0060373 A1* | 3/2016 | Wang | | C08K 5/52 428/36.9 |
| 2016/0068667 A1* | 3/2016 | Demirors | | C08J 5/18 428/220 |

FOREIGN PATENT DOCUMENTS

| | | |
|---|---|---|
| JP | 2013-189508 A | 9/2013 |
| KR | 10-1097378 B1 | 12/2011 |

OTHER PUBLICATIONS

Written Opinion (PCT/ISA/237) issued in PCT/KR2014/010307, mailed on Jan. 27, 2015.

* cited by examiner

OLEFIN RESIN

CROSS REFERENCE TO RELATED APPLICATIONS

This application is the National Phase of PCT International Application No. PCT/KR2014/010307, filed on Oct. 30, 2014, which claims priority under 35 U.S.C. 119(a) to Patent Application No. 10-2013-0130503, filed in the Republic of Korea on Oct. 30, 2013, Patent Application No. 10-2014-0011161, filed in the Republic of Korea on Jan. 29, 2014, Patent Application No. 10-2014-0011164, filed in the Republic of Korea on Jan. 29, 2014, Patent Application No. 10-2014-0149266, filed in the Republic of Korea on Oct. 30, 2014, Patent Application No. 10-2014-0149267, filed in the Republic of Korea on Oct. 30, 2014, and to Patent Application No. 10-2014-0149268, filed in the Republic of Korea on Oct. 30, 2014, all of which are hereby expressly incorporated by reference into the present application.

TECHNICAL FIELD

Exemplary embodiments of the present application relate to an olefin resin for an optoelectronic device encapsulant, a resin composition including the olefin resin, an encapsulant film, a method for manufacturing the optoelectronic device encapsulant, and an optoelectronic device.

BACKGROUND ART

An optoelectronic device such as a photovoltaic cell, a light emitting diode (LED), or organic light emitting diode (OLED), may include an encapsulant that encapsulates a light emission or light sensing site of the device.

For example, a solar cell module may be typically manufactured by a lamination method including laminating a transparent front substrate which is a light-receiving substrate, an encapsulant, a photovoltaic element, an encapsulant, and a back sheet, and then, thermally compressing the laminate while subjecting the laminate to vacuum suction.

DISCLOSURE

Technical Problem

Exemplary embodiments of the present application is directed to providing an olefin resin for an optoelectronic device encapsulant, which has a novel property, a resin composition including the olefin resin, an encapsulant film, a method for manufacturing the optoelectronic device encapsulant, and an optoelectronic device.

Technical Solution

One aspect of the present application provides a polyolefin resin having two crystallization temperatures (Tc). For example, the polyolefin resin having two crystallization temperatures may have excellent light transmittance, and may be applied for various photovoltaic elements, for example, an encapsulant that encapsulates the element of a solar cell.

In the present application, "an olefin resin" refers to a resin which includes a polymer or copolymer induced from olefin-based monomers, but does not include a resin blend. Here, "the polymer induced from monomers" refers to a polymer that includes the derivatives of the monomers, for example, the monomers, as a polymerization unit.

In addition, in the present specification, "a crystallization temperature" refers to a temperature that generates crystallization, such that the arrangement of an irregular substance structure is regularly changed by intermolecular/interatomic attraction, and for example, may be analyzed by a differential scanning calorimetry (DSC).

In one example, the crystallization temperature may be obtained as an exothermic peak temperature during cooling, that is, a peak temperature on a cooling curve of a heat flow, which is obtained by filling about 0.5 mg to 10 mg of a sample in a measuring vessel, increasing the temperature from 0° C. to 200° C. at a heating rate of 20° C./min such that a nitrogen gas flow rate is to be 20 ml/min and the thermal histories of the polyolefin resin are identical, maintaining as it is for 2 minutes, and then, measuring with a DSC while cooling the temperature from 200° C. to −150° C. at a rate of 10° C./min.

In the present specification, "the peak" refers to the vertex or the top on the cooling curve or a heating curve as will be described below, and for example, a point having 0 of the slope of tangent line. However, among the points having 0 of the slope of tangent line, the points of inflection that are a point, in which a code value of the slope of tangent line is not changed, are not included.

The polyolefin resin according to an exemplary embodiment of the present application has two crystallization temperatures, for example, a first crystallization temperature of 20° C. to 35° C. and a second crystallization temperature that is higher than the first crystallization temperature. In one example, as for the polyolefin resin, the peaks on the cooling curve of heat flow measured with the DSC while cooling the temperature from 200° C. to −150° C. at a rate of 10° C./min may be exhibited at the temperatures, 20° C. to 35° C. and 35° C. to 75° C., respectively. In this case, the peak exhibited at 20° C. to 35° C. is the first crystallization temperature and the peak exhibited at 35° C. to 75° C. is the second crystallization temperature. In addition, it is preferable that the first crystallization temperature of the polyolefin resin may be 24° C. to 33° C. and the second crystallization temperature of the polyolefin resin may be 40° C. to 70° C.

The difference between the first crystallization temperature and the second crystallization temperature may be 10° C. or higher, for example, 15° C. or higher. When the difference between the first crystallization temperature and the second crystallization temperature is excessively small, the light transmittance of the polyolefin resin may be reduced, and the upper limit of the difference between the first crystallization temperature and the second crystallization temperature is not particularly limited, but it may be 50° C., for example.

In addition, the polyolefin resin of the present application may have a density of 0.850 g/cm$^3$ to 0.880 g/cm$^3$, for example, 0.855 g/cm$^3$ to 0.870 g/cm$^3$, 0.859 g/cm$^3$ to 0.880 g/cm$^3$, or 0.855 g/cm$^3$ to 0.877 g/cm$^3$. The density of the polyolefin resin may be controlled to be within the above-described range, such that the polyolefin resin has two crystallization temperatures.

In one example, as for the crystallization temperature, the polyolefin resin may have a high crystallization temperature as the density of the polyolefin resin increases. For example, when the density of the polyolefin resin is about 0.859 g/cm$^3$ to 0.862 g/cm$^3$, the first crystallization temperature and second crystallization temperature of the polyolefin resin may be exhibited at 23° C. to 28° C. and 40° C. to 45° C., respectively, or when the density of the polyolefin resin is about 0.875 g/cm$^3$ to 0.880 g/cm$^3$, the first crystallization temperature and second crystallization temperature of the polyolefin resin may be exhibited at 30° C. to 35° C. and 50° C. to 67° C., respectively.

Another aspect of the present application provides a polyolefin resin that has two crystallization temperatures as described above and also one melting temperature (Tm).

"The melting temperature" refers to a temperature, in which a polymer resin is changed from a state of solid to a state of liquid exhibiting fluidity, and the flow of the crystal part of the resin starts, and may be analyzed through the DSC described above.

For example, after measuring the crystallization temperature while cooling the sample from 200° C. to −150° C. at a rate of 10° C./min according to the above-described method, the melting temperature may be obtained as the temperature of an endothermic peak during heating, that is, the peak of a heating curve of a heat flow measured with a DSC while increasing the temperature of the sample from −150° C. to 200° C. at a rate of 10° C./min.

The polyolefin resin according to an exemplary embodiment of the present application may have one melting temperature, and for example, the peak of the heating curve of the heat flow measured with the DSC while increasing the sample from −150° C. to 200° C. at a rate of 10° C./min may be exhibited at 40° C. to 60° C.

The polyolefin resin may have a high melting temperature as the density of the polyolefin resin increases, and for example, when the density of the polyolefin resin is about 0.859 g/cm$^3$ to 0.862 g/cm$^3$, the melting temperature of the polyolefin resin may be exhibited at the temperature of 40° C. to 45° C., or when the density of the polyolefin resin is about 0.875 g/cm$^3$ to 0.880 g/cm$^3$, the melting temperature of the polyolefin resin may be exhibited at the temperature of 50° C. to 55° C.

When the melting temperature is excessively high, the encapsulant including the polyolefin resin may not be laminated on a substrate at a low temperature, and thus, there may be problems in that the processing temperature increases, thereby rising a cost. With this point in view, the melting temperature may be controlled to be within the above-described range.

In addition, the polyolefin resin of the present application satisfies the following Equation 1.

$$10° C. \leq |Tc^2 - Tc^1| - |Tm - Tc^2| \leq 20° C. \quad \text{[Equation 1]}$$

In Equation 1,
$Tc^1$ represents a first crystallization temperature,
$Tc^2$ represents a second crystallization temperature, and
$Tm$ represents a melting temperature.

The polyolefin resin satisfies the above Equation 1, and thus, the melting temperature is controlled so as not to be excessively high with respect to the relationship with the crystallization temperature. Therefore, the encapsulant including the polyolefin resin may be laminated on a substrate at a low temperature, and thus, the processing temperature may be controlled to be low, thereby performing economically the manufacturing process of an optoelectronic device.

In one example, the polyolefin resin of the present application may have an MFR value of 0.1 g/10 min to 20.0 g/10 min, for example, 0.5 g/10 min to 10.0 g/10 min, 1.0 g/10 min to 5.0 g/10 min, 0.6 g/10 min to 10.0 g/10 min, or 0.65 g/10 min to 5.0 g/10 min, on the basis of ASTM D1238, that is, the temperature of 190° C. and the load of 2.16 kg. When the polyolefin resin has the MFR value in the above-described range, for example, a resin composition as will be described below may exhibit excellent moldability. For example, in the case of the polyolefin resin, the above-described MFR value may be measured under the load of 2.16 kg at 190° C., but the present application is not limited thereto.

In one example, the polyolefin resin having two crystallization temperatures as described above may be induced from an olefin-based monomer, and for example, may include a polymer or copolymer induced from the olefin-based monomer. For example, the polyolefin resin having two crystallization temperatures may be an ethylene/α-olefin copolymer, an ethylene polymer, or a propylene polymer, and in an exemplary embodiment, may be an ethylene/α-olefin copolymer.

In one example, the olefin-based monomer may be one or more monomers selected from the group consisting of ethylene, propylene, and α-olefin-based monomers.

Examples of the α-olefin-based monomer may include a branched α-olefin-based monomer, such as, isobutylene; a linear α-olefin-based monomer, such as 1-butene, 1-pentene, 1-hexene, 1-heptene, 1-octene, 1-nonene, 1-decene, 4-phenyl-1-butene, 6-phenyl-1-hexene, 2-methyl-1-butene, 3-methyl-1-butene, 4-methyl-1-butene, 3-methyl-1-pentene, 4-methyl-1-hexene, 5-methyl-1-hexene, 3,3-dimethyl-1-pentene, 3,4-dimethyl-1-pentene, 4,4-dimethyl-1-pentene, and vinylcyclohexane; a halogen-substituted α-olefin-based monomer, such as hexafluoropropene, tetrafluoroethylene, 2-fluoropropene, fluoroethylene, 1,1-difluoroethylene, 3-fluoropropene, trifluoroethylene, or 3,4-dichloro-1-butene; a cyclic α-olefin-based monomer, such as cyclopentene, cyclohexene, norbornene, 5-methylnorbornene, 5-ethylnorbornene, 5-propylnorbornene, 5,6-dimethylnorbornene, and 5-benzylnorbornene; and the like, but the present application is not limited thereto.

In addition, the polyolefin resin having two crystallization temperatures may be a copolymer of ethylene and a α-olefin-based monomer or propylene or a α-olefin-based monomer, and for example, may be a copolymer of ethylene and one or more α-olefin-based monomers selected from the group consisting of 1-butene, 1-hexene, 4-methyl-1-pentene, and 1-octene, and preferably a copolymer of ethylene and 1-octene.

In the present specification, "the ethylene/α-olefin copolymer" refers to polyolefin including ethylene and α-olefin in a form of polymerization as a main component, and in detail, may refer to a copolymer that includes at least 50 mol % or more of ethylene as a polymerization unit, and also an olefin monomer having three or more carbon atoms or other comonomers as a polymerization unit, as well as a homopolymer of ethylene.

The copolymer includes all the polymers having different types of arrangements, even if the copolymer is prepared from the above-described monomers.

For example, in the exemplary embodiments of the present application, in order to properly control viscosity or physical properties of the resin composition according to the use thereof, the arrangement of the copolymer included in the olefin resin may be controlled in a random type, a cross-linking type, a block type, or different segments, and then may be used, and preferably, the copolymer may be a random copolymer in a random type.

Examples of the ethylene/α-olefin copolymer may include one or more selected from the group consisting of a low-density ethylene/α-olefin copolymer, an intermediate-density ethylene/α-olefin copolymer, a high-density ethylene/α-olefin copolymer, a very low-density ethylene/α- olefin copolymer, an ultralow-density ethylene/α-olefin copolymer, and a linear low-density ethylene/α-olefin copolymer.

The polyolefin resin having two crystallization temperatures of the present application may be prepared by polymerizing or copolymerizing the above-described olefin-based monomers under presence of a catalyst, but the present application is not particularly limited thereto. For example, the polyolefin resin may be prepared by coming the olefin-based monomers in contact with a catalyst composition as will be described below.

In one example, the polyolefin resin having two crystallization temperatures may be prepared by polymerizing the olefin-based monomers under presence of a dinuclear catalyst.

The dinuclear catalyst may be a dinuclear metallocene compound represented by the following structure, and the dinuclear metallocene compound is represented by the following Chemical Formula 1.

[Chemical Formula 1]

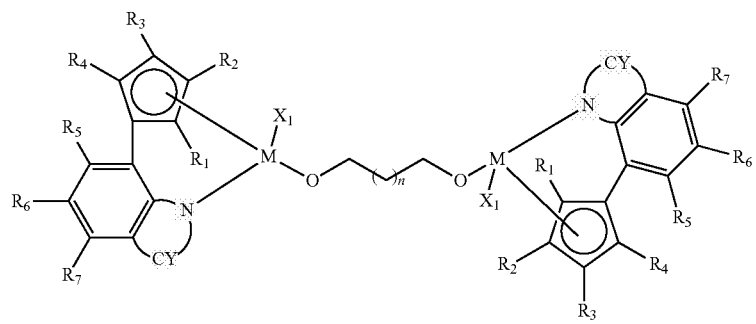

In Chemical Formula 1, $R_1$ to $R_4$ may be the same as or different from each other, and each independently hydrogen; a halogen radical; an alkyl radical having 1 to 20 carbon atoms; an alkenyl radical having 2 to 20 carbon atoms; a silyl radical; an aryl radical having 6 to 20 carbon atoms; an alkylaryl radical having 7 to 20 carbon atoms; or an arylalkyl radical having 7 to 20 carbon atoms; and two or more adjacent Rs of $R_1$ to $R_4$ may be bound each other to form a aliphatic ring or an aromatic ring;

$R_5$ to $R_7$ may be the same as or different from each other, and each independently, hydrogen; a halogen radical; an alkyl radical having 1 to 20 carbon atoms; an alkenyl radical having 2 to 20 carbon atoms; an aryl radical having 6 to 20 carbon atoms; an alkylaryl radical having 7 to 20 carbon atoms; an arylalkyl radical having 7 to 20 carbon atoms; an alkoxy radical having 1 to 20 carbon atoms; an aryloxy radical having 6 to 20 carbon atoms; or an amido radical; and two or more adjacent Rs of $R_5$ to $R_7$ may be bound each other to form a aliphatic ring or an aromatic ring;

CY may be an aliphatic ring or an aromatic ring including nitrogen and may be substituted or unsubstituted with halogen, and an alkyl or aryl radical having 1 to 20 carbon atoms, and when the substituent is plural in number, two or more substituents among the substituents may be bound each other to form an aliphatic ring or an aromatic ring;

M is a Group 4 transition metal;

$X_1$ is a halogen radical; an alkyl radical having 1 to 20 carbon atoms; an alkenyl radical having 2 to 20 carbon atoms; an aryl radical having 6 to 20 carbon atoms; an alkylaryl radical having 7 to 20 carbon atoms; an arylalkyl radical having 7 to 20 carbon atoms; an alkyl amido radical having 1 to 20 carbon atoms; an aryl amido radical 6 to 20 carbon atoms; or an alkylidene radical having 1 to 20 carbon atoms; and n is an integer of 0 to 10.

The dinuclear metallocene compound may have high affinity unlike a single-site catalyst, thereby providing a multi-site catalyst having high activity.

The dinuclear metallocene compound represented by the above Chemical Formula 1, the $R_1$ to $R_7$ are each independently hydrogen, an alkyl group having 1 to 20 carbon atoms, or an aryl group having 6 to 20 carbon atoms, and two adjacent Rs among the $R_1$ to $R_7$ may be bound each other to form one or more aliphatic rings or aromatic rings, but the present application is not limited thereto.

In addition, the CY may be a pentangonal or hexagonal aliphatic or aromatic ring including nitrogen substituted or unsubstituted with an alkyl group having 1 to 20 carbon atoms, but the present application is not limited thereto.

In addition, the M may be titanium (Ti), zirconium (Zr), or hafnium (Hf), and the $X_1$ may be halogen or an alkyl group having 1 to 20 carbon atoms, but the present application is not limited thereto.

Examples of the dinuclear metallocene compound represented by the above Chemical Formula 1 may include the following compound, but the present application is not limited thereto.

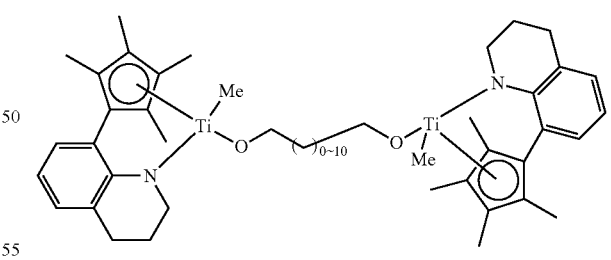

In one example, for example, the dinuclear metallocene compound represented by the above Chemical Formula 1 may be synthesized by the method including mixing a metallocene compound and a diol compound like the following Equation, and then stirring the mixture thus obtained for some period of time, but the present application is not limited thereto.

The dinuclear metallocene compound represented by the above Chemical Formula 1 has the structure in which two single-metallocene compounds bridged with a phenylene group introduced with a cyclic amido group are crosslinked with alkylenedioxy (—O—(CH$_2$)$_n$—O—). Therefore, the dinuclear metallocene compound has the characteristic in which two metal centers are linked by a diether chain that plays a role as a linker, and thus, unnecessary interactions between metals may be reduced, thereby giving stable catalytic activity and facilitating structural transformation.

Unlike a single-site catalyst, the dinuclear metallocene compound has high affinity to a substrate, and thus, exhibits high activity. For this reason, when the dinuclear metallocene compound is used as a catalyst for polyolefin polymerization or copolymerization, the polyolefin having high molecular weight and broad distribution of molecular weight may be produced in high activity. In addition, various substituents may be introduced to a cyclic amido ring such as, cyclopentadienyl and quinoline-based or indoline-based rings, such that it is ultimately possible to easily control electronic and three-dimensional environment around a metal. In other words, by using the compound having such a structure as a catalyst, the structure and physical properties of the olefin polymer thus produced may be easily controlled.

For polymerizing olefin-based monomers under presence of the dinuclear catalyst having a novel structure as described above, in addition to the dinuclear metallocene compound represented by the above Chemical Formula 1, the catalytic composition, which further includes one or more co-catalytic compounds selected from the group consisting of the compound represented by the following Chemical Formula 2, the compound represented by the following Chemical Formula 3, and the compound represented by the following Chemical Formula 4, may be used.

—[Al(R$_8$)—O]$_n$—      [Chemical Formula 2]

In Chemical Formula 2, R$_8$ is a halogen radical, a hydrocarbyl radical having 1 to 20 carbon atoms, or a hydrocarbyl radical having 1 to 20 carbon atoms, which is substituted with halogen, and n is an integer of 2 or more, D(R$_9$)$_3$      [Chemical Formula 3]

In Chemical Formula 3,

D is aluminum or boron, R$_9$ is a hydrocarbyl radical having 1 to 20 carbon atoms or a hydrocarbyl radical having 1 to 20 carbon atoms, which is substituted with halogen,

[L-H]$^+$[ZA$_4$]$^-$ or [L]$^+$[ZA$_4$]$^-$      [Chemical Formula 4]

In Chemical Formula 4,

L is a neutral or cationic Lewis base, H is a hydrogen atom, Z is a Group 13 element, and A is may be the same as or different from each other, and each independently, are an aryl group having 6 to 20 carbon atoms or an alkyl group having 1 to 20 carbon atoms in which 1 or more hydrogen atoms is substituted or unsubstituted with halogen, hydrocarbon having 1 to 20 carbon atoms, alkoxy or phenoxy.

Examples of the compound represented by the above Chemical Formula 2 may include methylaluminoxane (MAO), ethylaluminoxane, isobutylaluminoxane, butylaluminoxane, and the like.

Examples of the alkyl metal compound represented by the above Chemical Formula 3 may include trimethylaluminum, triethylaluminum, triisobutylaluminum, tripropylaluminum, tributylaluminum, dimethylchloroaluminum, dimethylisobutylaluminum, dimethylethylaluminum, diethylchloroaluminum, triisopropylaluminum, tri-s-butylaluminum, tricyclopentylaluminum, tripentylaluminum, triisopentylaluminum, trihexylaluminum, ethyldimethylaluminum, methyldiethylaluminum, triphenylaluminum, tri-p-tolylaluminum, dimethylaluminum methoxide, dimethylaluminum ethoxide, trimethylboron, triethylboron, triisobutylboron, tripropylboron, tributylboron, and the like.

Examples of the compound represented by the above Chemical Formula 4 may include triethylammonium tetraphenylboron, tributylammonium tetraphenylboron, trimethylammonium tetraphenylboron, tripropylammonium tetraphenylboron, trimethylammonium tetra(p-tolyl)boron, tripropylammonium tetra(p-tolyl)boron, triethylammonium tetra(o,p-dimethylphenyl)boron, trimethylammonium tetra (o,p-dimethylphenyl)boron, tributylammonium tetra(p-trifluoromethylphenyl)boron, trimethylammonium tetra(p-trifluoromethylphenyl)boron, tributylammonium tetrapentafluorophenylboron, N,N-diethylanilinium tetraphenylboron, N,N-diethylanilinium tetraphenylboron, N,N-diethylanilinium tetrapentafluorophenylboron, diethylammonium tetrapentafluorophenylboron, triphenylphosphonium tetraphenylboron, trimethylphosphonium tetraphenylboron, triethylammonium tetraphenylaluminum, tributylammonium tetraphenylaluminum, trimethylammonium tetraphenylaluminum, tripropylammonium tetraphenylaluminum, trimethylammonium tetra(p-tolyl) aluminum, tripropylammonium tetra(p-tolyl)aluminum, triethylammonium tetra(o,p-dimethylphenyl)aluminum, tributylammonium tetra(p-trifluoromethylphenyl)aluminum, trimethylammonium tetra(p-trifluoromethylphenyl)aluminum, tributylammonium tetrapentafluorophenylaluminum, N,N-diethylanilinium tetraphenylaluminum, N,N-diethylanilinium tetraphenylaluminum, N,N-diethylanilinium tetrapentafluorophenylaluminum, diethylammonium tetrapentafluorophenylaluminum, triphenylphosphonium tetraphenylaluminum, trimethylphosphonium tetraphenylaluminum, triphenylcarbonium tetraphenylboron, triphenylcarbonium tetraphenylaluminum, triphenylcarbonium tetra (p-trifluoromethylphenyl)boron, triphenylcarbonium tetrapentafluorophenylboron, dimethylanilinium tetrakis (pentafluorophenyl) borate, and the like.

The polyolefin resin may be prepared by a solution process using the catalytic composition. In addition, when the catalytic composition is used along with an inorganic carrier, such as silica, the polyolefin resin may be also prepared by a slurry-phase or gas-phase process.

In the solution process, it is possible to inject the catalytic composition after dissolving it in or diluting it with an aliphatic hydrocarbon solvent having 5 to 12 carbon atoms, which is suitable for an olefin polymerization process, for example, pentane, hexane, heptane, nonane, decane, and isomers thereof, an aromatic hydrocarbon solvent, such as toluene and benzene, a hydrocarbon solvent substituted with a chlorine atom, such as dichloromethane, chlorobenzene, and the like. The solvent used may be used after removing a small amount of water or air that acts as a catalytic poison by treating with a small amount of alkyl aluminum, and it is possible to further use a co-catalyst.

Especially, for preparing the polyolefin according to the present application, by using the catalytic composition, it is possible to perform a co-polymerization reaction of monomers having high steric hindrance, such as ethylene and 1-octene, and by using the dinuclear metallocene compound, it is possible to easily control electronic or three-dimensional environment around a metal, and also, it is ultimately possible to control the structure and physical properties of the polyolefin thus produced.

The polyolefin may be prepared using a continuously stirred tank reactor (CSTR) or a plug flow reactor (PFR). The reactors may be arranged in series or in parallel of two or more reactors, and also, may further include a separator so as to separate a solvent and unreacted monomers from the reaction mixture, continuously.

In one example, when the polyolefin resin is prepared by performing a continuous solution polymerization process, a process of preparing the polyolefin resin may include a catalytic process, a polymerization process, a solvent separation process, and a collecting process, as follows.

a) Catalytic Process

It is possible to inject the catalytic composition which is dissolved in or diluted with an aromatic or aliphatic solvent having 5 to 12 carbon atoms, which is substituted or unsubstituted with halogen that is suitable for an olefin polymerization process. Examples of the solvent may include an aliphatic hydrocarbon solvent, such as pentane, hexane, heptane, nonane, decane, and isomers thereof, an aromatic hydrocarbon solvent, such as toluene, xylene, and benzene, a hydrocarbon solvent substituted with a chlorine atom, such as dichloromethane, chlorobenzene, and the like. Here, the solvent used may be used after removing a small amount of water or air that acts as a catalytic poison by treating with a small amount of alkyl aluminum, and it is possible to further use a co-catalyst in large quantities.

b) Polymerization Process

The polymerization process may be performed by introducing a catalytic composition including the dinuclear metallocene compound represented by the above Chemical Formula 1 and a co-catalyst and one or more olefin-based monomers in a reactor. When a solution-phase and slurry-phase polymerization is performed, a solvent is injected in the reactor. The mixed solution of a solvent, a catalytic composition, and monomers is present in the reactor.

The mole ratio of the monomers to solvent, which is suitable for the reaction, may be controlled in consideration of the ratio that is suitable for dissolving raw materials before the reaction and polymers to be produced after the reaction. For example, the mole ratio of the monomers and solvent may be 10:1 to 1:10,000, 5:1 to 1:100, or 1:1 to 1:2. When the amount of solvent is too small, the viscosity of fluid increases, and thus, there may be a problem with the transport of the polymer produced. On the other hand, when the amount of solvent is excessively large, there may be a problem with the increase in energy costs and the increase in facilities according to the refinement and recycling of the solvent because the amount of solvent is more than necessary. In consideration of such problems, the amount of solvent may be properly controlled in the above-described range.

The solvent may be added into a reactor in the temperature of −40° C. to 150° C. using a heater or a refrigerator, and then, a polymerization reaction begins along with the monomers and catalytic composition. There is a small difference according to the reacting amount, but generally, when the temperature of solvent is too low, the reaction temperature also decreases, and it may be difficult to control the temperature. When the temperature of solvent is too high, it is difficult to remove heat of reaction according to the reaction. In consideration of such a problem, the temperature of solvent may be controlled in the above-described range.

In addition, by supplying supplies (a solvent, monomers, a catalytic composition, and the like) after increasing 50 bar or more of the pressure using a high-capacity pump, it is possible to pass the mixture of the supplies through a reactor arrangement, a pressure dropping device, and a separator without a further pumping.

The internal temperature, that is, polymerization reaction temperature in the reactor may be controlled to be −15° C. to 300° C., for example, 50° C. to 200° C. or 50° C. to 150° C. When the internal temperature is excessively low, there may be a problem in that productivity is low due to the low rate of the reaction, and when the internal temperature is too high, there may be problems in that impurities are produced according to a side reaction and discoloration such as the carbonization of polymer is generated. In consideration of such a problem, the internal temperature of the reactor may be controlled in the above-described range.

The internal pressure in the reactor may be controlled to be 1 bar to 300 bar, for example, 30 to 200 bar or 30 to 50 bar. When the internal pressure is excessively low, the rate of reaction is low, and thus, the productivity is low, and there may be problems according to the evaporation of a solvent used. When the internal pressure is excessively high, there may be a problem for the increase in facility costs, such as an installation cost according to the high pressure. In consideration of such a problem, the internal pressure in the reactor may be controlled in the above-described range.

The polymer produced in the reactor may be maintained at a concentration of less than 20 wt % in a solvent, and then, may be transferred into a first solvent separation process in order to remove a solvent after a short stay time. The stay time of the polymer produced in the reactor may be 1 minute to 10 hours, for example, 3 minutes to 1 hour or 5 minutes to 30 minutes. When the stay time is excessively short, there may be problems in that due to the short stay time, the productivity decreases, the catalyst is lost, and thus, the producing cost increases. When the stay time is excessively long, according to the reaction that is more than a reasonable active period of catalyst, the reactor becomes larger, and thus, the facility cost increases. In consideration of such a problem, the stay time in the reactor may be controlled in the above-described range.

c) Solvent Separation Process

The solvent may be separated by changing the solution temperature and pressure so as to remove the solvent that is along with the polymer coming out through the reactor. For example, the temperature of the polymer solution transferred from the reactor is increased to be from about 200° C. to 230° C. through a heater, and then, through the pressure dropping device, the pressure is decreased. The unreacted raw material and solvent may be evaporated in the first separator. At this time, the pressure in the separator may be controlled to be 1 to 30 bar, for example, 1 to 10 bar or 3 to 8 bar. When the pressure in the separator is excessively low, the content of polymer increases, and thus, there may be a problem with the transfer of the polymer, and when the pressure is excessively high, it is difficult to separate the solvent used for the polymerization process. In consideration of such a problem, the pressure in the separator may be controlled in the above-described range.

In addition, the temperature in the separator may be controlled to be 150° C. to 250° C., for example, 170° C. to 230° C. or 180° C. to 230° C. When the temperature in the separator is excessively low, the viscosities of copolymer and mixture thereof increase, and thus, there may be a problem for the transfer, and when the temperature is excessively high, there may be a problem for the discoloration according to the carbonization of polymer due to the discoloration according to the high temperature. In consideration of such a problem, the temperature in the separator may be controlled in the above-described range.

The solvent evaporated in the separator may be recycled to a reactor that is condensed in an overhead system. After passing through a first solvent separation process, the 65%-concentrated polymer solution may be obtained. The 65%- concentrated polymer solution is transferred to a second separator by a transfer pump through a heater, and a separation process to a remained solvent is performed in the second separator. A thermal stabilizer may be added so as to prevent the deformation of polymer by a high temperature during passing through a heater, and also, a reaction inhibitor may be added along with the thermal stabilizer to the heater so as to inhibit the reaction of polymer by the remained activity of activated complex in the polymer solution. The remained solvent in the polymer solution added into the second separator is completely removed by a vacuum pump, finally, and then, the polymer solution thus obtained passes through cooling water and a cutter to obtain a granulated polymer. The vaporized solvent and other unreacted monomers in the second separation process may be reused after purifying them through a collecting process.

d) Collecting Process

The organic solvent that is added along with raw materials to the polymerization process in the first solvent separation process may be recycled along with the unreacted raw materials to the polymerization process. However, the solvent collected in the second solvent separation process is contaminated by the addition of reaction inhibitor for stopping catalytic activity and includes a large amount of water due to the action of catalytic poison in the solvent by supplying steam in the vacuum pump, and thus, it is preferable to reuse the solvent collected in the second solvent separation process after purifying the solvent through the collecting process.

The olefin resin having two crystallization temperatures prepared by the method as described above may be included in a resin composition for manufacturing an encapsulant for an optoelectronic device, and when the encapsulant for an optoelectronic device including a modified olefin resin prepared by a reactive extrusion of the resin composition (hereinafter, a resin composition) including the olefin resin is laminated at a low temperature, the encapsulant has excellent adhesive strength, high light transmittance, and low haze value.

In the present specification, "the modified olefin resin" and "modified ethylene/α-olefin copolymer" are used as the same meanings as the copolymer including a branched chain represented by Chemical Formula 7 as will be described below. In addition, in order to distinguish with the modified olefin resin or modified ethylene/α-olefin copolymer as described above, the ethylene/α-olefin copolymer grafted only with an unsaturated silane compound without an amino silane compound is defined as "the silane modified olefin resin" or "silane modified ethylene/α-olefin copolymer".

In one example, the resin composition may further include an unsaturated silane compound and a radical initiator, in addition to the olefin resin having two crystallization temperatures according to the present application described above.

The unsaturated silane compound included in the resin composition is represented by the following Chemical Formula 5, and may be grafted to a main chain including the olefin-based monomers as a polymerization unit under presence of a radical initiator in the olefin resin to prepare the modified olefin resin or silane modified olefin resin. For example, the resin composition may be subjected to a reactive extrusion to prepare the silane modified olefin resin, which is grafted with the unsaturated silane compound represented by the following Chemical Formula 5 to the olefin resin.

$$DSiR^{10}{}_pR^{11}{}_{(3-p)}$$ [Chemical Formula 5]

In Chemical Formula 5, D represents alkenyl that is bound to a silicon atom.

The alkenyl refers to at least one or more unsaturated groups, for example, a functional group having a double bond, and the carbon number of the alkenyl may be 2 to 20, 2 to 12, or 2 to 6. Examples of the alkenyl, that is, the D, may include vinyl, allyl, propenyl, isopropenyl, butenyl, hexenyl, cyclohexenyl, or γ-methacryloxypropyl, and in one example, may be vinyl.

$R^{10}$ may represent a hydroxyl group, halogen, an amine group, or $-R^{12}R^{13}$, which is bound to a silicon atom, $R^{12}$ may represent an oxygen or sulfur atom, $R^{13}$ may represent an alkyl group, an aryl group, or an acyl group, and $R^{11}$ may represent hydrogen, an alkyl group, an aryl group, or an aralkyl group, which is bound to a silicon atom.

In one example, the $R^{10}$ may be a reactive functional group that can be hydrolyzed by the approach of water being in a system, and examples of the $R^{10}$ may include an alkoxy group, an alkylthio group, an aryloxy group, an acyloxy group, a halogen group, or an amine group. In this case, examples of the alkoxy group may include an alkoxy group having 1 to 20 carbon atoms, 1 to 12 carbon atoms, 1 to 8 carbon atoms, or 1 to 4 carbon atoms; examples of the acyloxy group may include an acyloxy group having 1 to 12 carbon atoms, 1 to 8 carbon atoms, or 1 to 4 carbon atoms; and examples of the alkylthio group may include an alkylthio group having 1 to 12 carbon atoms, 1 to 8 carbon atoms, or 1 to 4 carbon atoms.

In addition, in an exemplary embodiment, $R^{10}$ in the above chemical Formula 5 may be an alkoxy group, and in detail, may be an alkoxy group having 1 to 12 carbon atoms or 1 to 8 carbon atoms. In other exemplary embodiments, the $R^{10}$ may be an alkoxy group having 1 to 4 carbon atoms, and for example, a methoxy group, an ethoxy group, a propoxy group, an isopropoxy group, or a butoxy group.

For example, in some exemplary embodiments, a methoxy group or an ethoxy group may be used.

In addition, the $R^{11}$ may be an unreactive functional group, and for example, the $R^{11}$ may be hydrogen, an alkyl group, an aryl group, or an aralkyl group. Here, the alkyl group, for example, may be an alkyl group having 1 to 12 carbon atoms, 1 to 8 carbon atoms, or 1 to 4 carbon atoms. In addition, the aryl group may be an aryl group having 6 to 18 carbon atoms or 6 to 12 carbon atoms, for example, a phenyl group, and the aralkyl group may be an aralkyl group having 7 to 19 carbon atoms or 7 to 13 carbon atoms, for example, a benzyl group.

In addition, in above Chemical Formula 5, p represents an integer of 1 to 3, and in some exemplary embodiments, may represent 3.

The specific examples of the unsaturated silane compound represented by the above Chemical Formula 5 may include vinyl alkoxy silane. Examples of the unsaturated silane compound may include vinyltrimethoxy silane, vinyltriethoxy silane, vinyltripropoxy silane, vinyltriisopropoxy silane, vinyltributoxy silane, vinyltripentoxy silane, vinyltriphenoxy silane, or vinyltriacetoxy silane. In one example, among them, vinyltrimethoxy silane or vinyltriethoxy silane may be used, but the present application is not limited thereto.

In one example, the resin composition may include the unsaturated silane compound represented by the above Chemical Formula 5 in the amount of 0.1 part by weight to 10.0 parts by weight, 0.5 part by weight to 7.0 parts by weight, 1.0 part by weight to 5.5 parts by weight, or 0.5 part by weight to 5.0 parts by weight, with respect to 100 parts by weight of the total resin composition. In such a range, it is possible to maintain an excellent adhesive property of the silane modified olefin resin, for example, the adhesive property to a glass substrate, a back sheet, and the like.

Unless otherwise defined herein, the unit, part by weight in the present specification refers to a weight ratio.

In one example, the resin composition may include a radical initiator. The radical initiator may play a role in initiating the reaction that the unsaturated silane compound is grafted to the olefin resin.

The radical initiator is not particularly limited as long as it can initiate the radical polymerization of a vinyl group, and examples thereof may include one or two or more selected from the group consisting of organic peroxides, hydroperoxide, or an azo compound. In detail, examples of the radical initiator may include one or more selected from the group consisting of dialkyl peroxides, such as t-butyl-cumylperoxide, di-t-butyl peroxide, di-cumyl peroxide, 2,5-dimethyl-2,5-di(t-butylperoxy)hexane, and 2,5-dimethyl-2,5-di(t-butylperoxy)-3-hexyne; hydroperoxides, such as, cumene hydroperoxide, diisopropyl benzene hydroperoxide, 2,5-dimethyl-2,5-di(hydroperoxy)hexane, and t-butylhydroperoxide; diacylperoxides, such as, bis-3,5,5-trimethylhexanoyl peroxide, octanoylperoxide, benzoyl peroxide, o-methylbenzoyl peroxide, and 2,4-dichlorobenzoyl peroxide; peroxy esters, such as, t-butylperoxy isobutyrate, t-butylperoxy acetate, t-butylperoxy-2-ethylhexanoate, t-butylperoxy pivalate, t-butylperoxy octoate, t-butylperoxy isopropyl carbonate, t-butylperoxy benzoate, di-t-butylperoxy phthalate, 2,5-dimethyl-2,5-di(benzoylperoxy)hexane, and 2,5-dimethyl-2,5-di(benzoylperoxy)-3-hexyne; and azo compounds including ketone peroxides, such as methylethylketone peroxide and cyclohexanone peroxide, lauryl peroxide, azobisisobutyronitrile, and azobis(2,4-dimethylvaleronitrile), but the present application is not limited thereto. The radical initiator may be included in the amount of 0.001 part by weight to 5 parts by weight with respect to 100 parts by weight of the total resin composition.

In one example, the resin composition may further include an amino silane compound in addition to the unsaturated silane compound. The amino silane compound may play a role as a catalyst that catalyzes the hydrolysis reaction for converting the reactive functional group such as an alkoxy group of the unsaturated silane compound grafted to the olefin resin in the grafting modification step of ethylene/α-olefin copolymer, for example, into a hydroxyl group, and thus, can improve adhesion strength with the upper and lower parts of a glass substrate or a back sheet composed of a fluorine resin. In addition, at the same time, the amino silane compound is directly involved as a reactant in a copolymerization reaction, and thus, may provide a moiety having an amine functional group to the modified olefin resin.

The amino silane compound may be a compound represented by the following Chemical Formula 6.

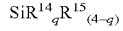  [Chemical Formula 6]

In Chemical Formula 6, $R^{14}$ represents —$(CH_2)_rNR^{16}R^{17}$ which is bound to a silicon atom, $R^{16}$ and $R^{17}$ each independently represent hydrogen or $R^{18}NH_2$, which is bound to a nitrogen atom, and le represents alkylene having 1 to 6 carbon atoms.

In addition, $R^{15}$ represents halogen, an amine group, —$R^{19}R^{20}$, or —$R^{20}$, which is bound to a silicon atom, $R^{19}$ represents an oxygen or sulfur atom, and R° represents hydrogen, an alkyl group, an aryl group, an aralkyl group, or an acyl group.

In this case, the q represents an integer of 1 to 4, and r represents an integer of 0 or more.

Here, the alkyl group, aryl group, aralkyl group, acyl group, and alkylene are the same as described above, and thus, the explanation thereof will not be provided. $19_R20$, Preferably, in the above Chemical Formula 6, $R^{15}$ may represent —$R^{19}R^{20}$, which is bound to a silicon atom, $R^{19}$ may represent an oxygen atom, $R^{20}$ may represent hydrogen, an alkyl group, an aryl group, an aralkyl group, or an acyl group, $R^{14}$ may represent —$(CH_2)_rNR^{16}R^{17}$, which is bound to a silicon atom, $R^{16}$ and $R^{17}$ may represent hydrogen, or $R^{16}$ may represent hydrogen and $R^{17}$ may represent $R^{18}NH_2$, and here, $R^{18}$ may represent alkylene having 1 to 3 carbon atoms. In addition, in this case, r may represent an integer of 2 to 5.

The amino silane compound may be added in the olefin resin-modifying step, that is, the step of preparing the modified olefin resin.

In addition, the amino silane compound may not have a bad influence on other components included in the composition, for example, a UV stabilizer and the like, as will be described below and may stably maintain the overall physical properties of the composition as intended.

The compound that can be used as the amino silane compound is a silane compound including an amine group, for example, primary amine and secondary amine, but the present application is not limited thereto. Examples of the amino silane compound may include aminotrialkoxysilane, aminodialkoxysilane, and the like, and examples thereof may include one or more selected from the group consisting of 3-aminopropyltrimethoxysilane (APTMS), 3-aminopropyltriethoxysilane (APTES), bis[(3-triethoxysily)propyl]amine, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine (DAS), aminoethylaminopropyltriethoxysilane, aminoethylaminopropylmethyldimethoxysilane, aminoethylaminopropylmethyldiethoxysilane, aminoethylaminomethyltriethoxysilane, aminoethylaminomethylmethyldiethoxysilane, diethylenetriaminopropyltrimethoxysilane, diethylenetriaminopropyltriethoxysilane, diethylenetriaminopropylmethyldimethoxysilane, diethyleneaminomethylmethyldiethoxysilane, (N-phenylamino)methyltrimethoxysilane, (N-phenylamino)methyltriethoxysilane, (N-phenylamino)methylmethyldimethoxysilane, (N-phenylamino)methylmethyldiethoxysilane, 3-(N-phenylamino)propyltrimethoxysilane, 3-(N-phenylamino)propyltriethoxysilane, 3-(N-phenylamino)propylmethyldimethoxysilane, 3-(N-phenylamino)propylmethyldiethoxysilane, and N-(N-butyl)-3-aminopropyltrimethoxysilane. The amino silane compound may be used singly or in combination of two or more of them.

The amino silane compound may be included in the amount of 0.01 to 1 part by weight with respect to 100 parts by weight of the total resin composition, and may be included in the amount of 0.01 to 0.5 part by weight, 0.1 to 0.25 part by weight, 0.2 to 0.5 part by weight, 0.5 to 1.25 parts by weight, 0.1 to 1.5 parts by weight, or 0.2 to 2.0 parts by weight. In the above-described weight ratio, the physical properties of the resin composition may be effectively controlled, the adhesion strength with the front substrate and back sheet as described above may be increased, and the activities of other additives included in the resin composition may be excellently maintained. When the content of the amino silane compound added is large, the resin may be early decolorized or a large amount of gel may be formed during the process, thereby giving a bad influence on the configuration of sheet to be produced.

The amino silane compound may be included in the content of 1 to 35 parts by weight, for example, 2 to 6 parts by weight, 2 to 5.5 parts by weight, 5 to 5.5 parts by weight, 2 to 15 parts by weight, 5 to 15 parts by weight, 10 to 35 parts by weight, 5 to 35 parts by weight, 15 to 33.3 parts by weight, or 2 to 33.3 parts by weight, with respect to 100 parts by weight of the unsaturated silane compound in the total resin composition. In addition, the amino silane compound may be included in the content of 1 to 40 parts by weight, for example, 2 to 30 parts by weight, 2 to 25 parts by weight, 1 to 25 parts by weight, 2 to 6 parts by weight, 1 to 10 parts by weight, 4 to 12 parts by weight, 5 to 10 parts by weight, 2 to 10 parts by weight, or 2 to 5 parts by weight, with respect to 100 parts by weight of the silane compound in the total resin composition. When the resin composition that is controlled to be in the content range of the amino silane compound is reaction extruded, the adhesion strength between the encapsulant for an optoelectronic device to be manufactured and a front substrate is exhibited to be excellent. When the amino silane compound is excessively included in the large amount, the yellowness index of encapsulant to be manufactured may increase, thereby influencing on other physical properties of the encapsulant.

The amino silane compound and unsaturated silane compound are similar in terms of including a silyl group, but are different in terms of including an amine functional group and an unsaturated group, respectively. For example, the resin composition may include both of two substances, and in this case, as compared with the case of including one of two substances, excellent adhesion performance can be provided. Here, as the amino silane compound is added, the adhesion performance may be absolutely improved regardless of the content of the unsaturated silane compound, but even when the unsaturated silane compound of the same content condition is used, the adhesion performance in the case of adding the amino silane compound may be more improved.

Further, according to the exemplary embodiments of the present application, it is possible to provide the encapsulant having very excellent adhesion performance as compared with the case of manufacturing an encapsulant simply using alkyl silane and alkylamine. For example, when only alkylamine is used, the alkylamine does not involve in a grafting polymerization reaction, unlike a vinyl silane or amino silane compound, and thus, is remained as a substance in a system, and since then, transferred on the surface of the modified olefin resin or on the surface of the sheet during manufacturing the encapsulant on a sheet. Therefore, the substances remained in a system result in a decrease in long-term durability. Further, for some alkylamine, there is a problem in that some alkylamine has a melting point of about 27° C. to 29° C., and the miscibility with other reactants, for example, a liquid-phase silane compound, decreases at the range of the above temperature or less.

The resin composition may further include one or more additives selected from the group consisting of a light stabilizer, an UV absorbent, and a thermal stabilizer, if necessary.

The light stabilizer may play a role in preventing photo-oxidation by catching active species in light degradation initiation in the olefin resin according to a use of the composition to be applied. A type of the light stabilizer that can be used may be, but is not limited to, for example, a known compound, such as hindered-amine-based compounds or hindered-piperidine-based compounds.

The UV absorbent may play a role in preventing excitation of active species in light degradation initiation in the olefin resin by absorbing ultraviolet light from the light of the sun and then converting the ultraviolet light into thermal energy that is harmless in a molecule according to a use of the composition. A specific type of the UV absorbent that can be used may be, but is not limited to, for example, a mixture of one or two or more absorbents of a benzophenone-based UV absorbent, a benzotriazole-based UV absorbent, an acrylonitrile-based UV absorbent, a metal complex-based UV absorbent, a hindered-amine-based UV absorbent, an inorganic-based UV absorbent, such as ultrafine titanium oxide or ultrafine zinc oxide, and the like.

In addition, examples of the thermal stabilizer may include phosphorus-based thermal stabilizer, such as, tris(2,4-tries)phosphite, bis[2,4-bis(1,1-dimethylethyl)-6-methylphenyl]ethylester phosphoric acid, tetrakis(2,4-tries)[1,1-biphenyl]-4,4' -diylbisphosphonate, and bis(2,4-tries) pentaerythritoldiphosphite; and lactone-based thermal stabilizer, such as, a reaction product of 8-hydroxy-5,7-di-tert-butyl-furan-2-one and o-xylene, and one or two or more thermal stabilizers among them may be used.

In the resin composition, the contents of the light stabilizer, UV absorbent, and/or thermal stabilizer are not particularly limited. In other words, the content of the above additives may be properly selected in consideration of a use of the resin composition, a form or density of additive, and the like, and generally, may be properly controlled in the range of 0.01 part by weight to 5 parts by weight with respect to 100 parts by weight of the resin composition.

In addition, the exemplary resin composition may further include various additives that are known in the related art, properly, according to a use of the resin component applied in addition to the above-described components.

Another exemplary embodiment of the present application may provide a method for manufacturing an encapsulant for an optoelectronic device using the above-described resin composition and an encapsulant for an optoelectronic device thus obtained.

In one example, the method for manufacturing an encapsulant for an optoelectronic device may include preparing a modified olefin resin.

The method for preparing the modified olefin resin may include, but is not limited to, for example, preparing the resin composition including an unsaturated silane compound and olefin resin having two crystallization temperatures of the present application or the resin composition including the olefin resin having two crystallization temperatures of the present application, an unsaturated silane compound, and an amino silane compound; mixing the resin composition in a reactor; and performing the grafting extrusion reaction of the resin composition through a heat-melting under presence of a proper radical initiator.

A type of a reactor for preparing the modified olefin resin is not particularly limited as long as a desired resin can be prepared by heat-melting or reacting the liquid-phase reactants. For example, the reactor may be an extruder or an extruder including a hopper. When such a reactor is used, for example, the modified olefin resin may be prepared by extruding the mixture prepared after adding a liquid-phase unsaturated silane compound, amino silane compound, and radical initiator to the olefin resin that is heat-melted through an extruder or by heat-melting in the extruder after mixing the olefin resin, radical initiator, amino silane compound, and unsaturated silane compound in the hopper, and then adding the mixture thus obtained.

Other additives, such as, a UV absorbent, a thermal stabilizer, or an UV stabilizer may be added to the modified olefin resin prepared as described above, and the additives may be added to the reactor before or after forming the modified olefin resin. As an example, the process may be simplified by performing the preparation of the modified olefin resin and the mixing of the modified olefin resin thus obtained along with the additives in one reactor at the same time.

Here, other additives may be added in the reactor as it is or may be added in a type of master batch and mixed. Here, the master batch refers to a raw material in a shape of pellet that is prepared by concentrating the additives in a high concentration and then dispersing them, and generally, may be used in order to introduce the additives having a specific function to a final product for molding a plastic raw material in a method, such as, an extrusion or injection.

The method for adding an additive to a reactor for forming a modified olefin resin is not particularly limited, and for example, may be a method in which a side feeder is provided at a proper position of a cylinder or extruder, and the additives in a type of master batch is added through the feeder, or a method in which the additives are mixed with the olefin resin in a hopper and then added.

In the above method, a specific type and design of the reactor, the conditions, such as heat-melting, mixing, or the temperature and time of the reaction, or a method for preparing a master batch are not particularly limited, and may be properly selected in consideration of raw materials used.

In addition, an encapsulant film for an optoelectronic device may be manufactured by molding the resin composition in a shape of film or sheet. Such a molding method is not particularly limited, and for example, an encapsulant may be manufactured by forming a sheet or film using a general process, such as, a T-die process or an extrusion. In exemplary embodiments of the present application, an in situ process may be performed using a device, in which the preparation of the modified olefin resin as described above, the preparation of the resin composition including the same, and a process for forming a sheet or a film are connected to each other.

The encapsulant for an optoelectronic device includes a reaction extrusion product of the resin composition including the olefin resin having two crystallization temperatures as described above, and thus, the encapsulant may exhibit the peaks on the cooling curve and heating curve of a heat flow, which is measured with a DSC while increasing and decreasing at the temperatures of −120° C. to 600° C., at 20° C. to 35° C. and 35° C. to 75° C., respectively. In this case, the peak exhibited at 20° C. to 35° C. is a first crystallization temperature and the peak exhibited at 35° C. to 75° C. is a second crystallization temperature. In addition, preferably, the first crystallization temperature of the encapsulant may be 24° C. to 33° C. and the second crystallization temperature of the encapsulant may be 40° C. to 70° C. "The reaction extrusion product" refers to the modified olefin resin or silane modified olefin resin prepared by adding the resin composition to an extrusion reactor and then reacting.

In addition, the encapsulant may be manufactured using the resin composition including the polyolefin resin having two crystallization temperatures as described above, and thus, even when the encapsulant is manufactured by laminating at a low lamination temperature, excellent optical properties, such as, high light transmittance and low haze value are exhibited.

For example, the encapsulant film satisfies the following Equation 2.

$$T_t \geq 91.0\% \qquad \text{[Equation 2]}$$

In Equation 2, $T_t$ represents total light transmittance measured with a haze meter after laminating the encapsulant film on a glass substrate at the temperature of 110° C.

In addition, the encapsulant film satisfies the following Equation 3.

$$H_z \leq 4.6\% \qquad \text{[Equation 3]}$$

In Equation 3, $H_z$ represents a haze measured with a haze meter after laminating the encapsulant film on a glass substrate at the temperature of 110° C.

The total light transmittance and haze may be the values, which are measured with a haze meter to the light at the wavelengths of 200 nm or more, for example, the light at the wavelength of 300 nm, 350 nm, 400 nm, 450 nm, 500 nm, 550 nm, or 600 nm, and preferably may be the values, which are measured with a haze meter to the light at the wavelength of 550 nm. Here, the total light transmittance and haze of the encapsulant film of the present application, which are measured as described above, refer to the total light transmittance and haze of the laminate manufactured by laminating the encapsulant film on a glass substrate, and the glass substrate and encapsulant film may be laminated through a vacuum laminator.

In addition, the total light transmittance may be measured using a UV/Vis spectroscopy. In this case, the total light transmittance may be the value measured using a UV/Vis spectroscopy to the light at the wavelengths of 200 nm or more, for example, to the light at the wavelengths of 200 nm to 1300 nm, 250 to 1300 nm, or 300 to 1100 nm.

The total light transmittance of the encapsulant film may be 91.0% or more, for example, 91.2% or more, 91.3% or more, 91.5% or more, 91.7% or more, or 91.9% or more, as the value measured after laminating the encapsulant film on a glass substrate at the temperature of 110° C., and in consideration of the photoelectric efficiency of an optoelectronic device, the encapsulant film may be controlled to have the total light transmittance in the above-described range.

In addition, the haze of the encapsulant film may be 4.6% or less, for example, 4.0% or less, 3.5% or less, 3.0% or less, 2.5% or less, 2.0% or less, or 1.5% or less, as the value measured after laminating the encapsulant film on a glass substrate at the temperature of 110° C., and in consideration of the photoelectric efficiency of an optoelectronic device, the encapsulant film may be controlled to have the haze value in the above-described range.

In the present application, the copolymer as will be described below, that is, the modified olefin resin may be provided by extruding the reaction extrusion product of the resin composition, for example, the resin composition according to the above-described method, and for example, the copolymer may be included in the encapsulant for an optoelectronic device. The modified olefin resin includes the olefin resin having two crystallization temperatures as described above in a polymerized type, and thus, exhibits excellent optical properties, such as, high light transmittance and low haze.

In one example, the copolymer includes a main chain including the olefin-based monomers as a polymerization unit; and a branched chain, which is bound to the main chain and represented by the following Chemical Formula 7.

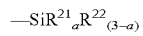   [Chemical Formula 7]

In Chemical Formula 7, $R^{21}$ and $R^{22}$ each independently represent halogen, an amine group, $-R^{23}R^{24}$, or $-R^{24}$, which is bound to a silicon atom, $R^{23}$ represents an oxygen or a sulfur atom, $R^{24}$ represents hydrogen, an alkyl group, an aryl group, an aralkyl group, or an acyl group, and a represents an integer of 1 to 3.

Preferably, in Chemical Formula 7, $R^{21}$ and $R^{22}$ each independently may represent $-R^{23}R^{24}$, which is bound to a silicon atom, $R^{23}$ may represent oxygen, and $R^{24}$ may represent hydrogen or an alkyl group.

In one example, the copolymer may further include a branched chain, which is bound to a main chain and represented by the following Chemical Formula 8.

$$-SiR^{25}{}_bR^{26}{}_{2-b)}R^{27} \qquad \text{[Chemical Formula 8]}$$

In Chemical Formula 8, $R^{25}$ and $R^{26}$ each represent halogen, an amine group, $-R^{28}R^{29}$, or $-R^{29}$, which is bound to a silicon atom, $R_{28}$ represents an oxygen or a sulfur atom, $R^{29}$ represents hydrogen, an alkyl group, an aryl group, an aralkyl group, or an acyl group, and b represents an integer of 1 or 2, $R^{27}$ represents $-OSiR^{30}{}_cR^{31}{}_{(2-c)}R^{32}$, which is bound to a silicon atom, $R^{30}$ and $R^{31}$ each independently represent halogen, an amine group, $-R^{33}R^{34}$, or $-R^{34}$, which is bound to a silicon atom, $R^{33}$ represents an oxygen or a sulfur atom, and $R^{34}$ represents hydrogen, an alkyl group, an aryl group, an aralkyl group, or an acyl group, $R^{32}$ represents $-(CH_2)_dNR^{35}R^{36}$, which is bound to a silicon atom, $R^{35}$ and $R^{36}$ each independently represent hydrogen or $R^{37}NH_2$, which is bound to a silicon atom, and $R^{37}$ represents an alkylene, and the c represents an integer of 1 or 2 and d represents an integer of 0 or more.

The copolymer includes, for example, a branched chain, which is grafted at a main chain including olefin-based monomers as a polymerization unit and represented by the above Chemical Formula 7, and also, may further include a branched chain represented by the above Chemical Formula 8. When the copolymer further includes a branched chain represented by the above Chemical Formula 8, the copolymer may have the structure having the moiety, in which a hydrocarbon group in some silyl groups is converted into a hydroxyl group, and also the moiety having an amine functional group. The copolymer includes the moiety having the converted hydroxyl group and also the amine functional group, and thus, for example, a hydrogen bond between the amine functional group and hydroxyl group on the surface of a glass substrate at the lower part of the encapsulant in an optoelectronic device may be formed, thereby providing more excellent adhesion strength. In addition, many hydrogen bonds with the back sheet composed of a fluorine resin at the upper part of the encapsulant may be formed, thereby providing excellent adhesion strength.

In one example, the carbon atoms in the alkyl group in the above Chemical Formulas 7 and 8 may be 1 to 20, 1 to 12, 1 to 8, or 1 to 4, and for example, a methyl group, an ethyl group, a propyl group, or a butyl group, but the present application is not limited thereto.

In addition, the carbon atoms in the aryl group in the above Chemical Formulas 7 and 8 may be 6 to 20, 6 to 18, or 6 to 12, and for example, a phenyl group or a naphthyl group, but the present application is not limited thereto.

The aralkyl group in the above Chemical Formulas 7 and 8 refers to the alkyl group, in which at least one or more hydrogen atoms among the hydrogen atoms of hydrocarbon group of the alkyl group are substituted with the aryl radicals, and the carbon number of the aralkyl group may be 7 to 40, 7 to 19, or 7 to 13. The carbon number of the aralkyl group refers the number of total carbon atoms included in the alkyl group and aryl radical.

The alkylene group in the above Chemical Formulas 7 and 8 may be a linear or branched alkylene group having 1 to 16 carbon atoms, 1 to 12 carbon atoms, 1 to 6 carbon atoms, or 1 to 4 carbon atoms, and for example, may be an ethylene group or a propylene group, but the present application is not limited thereto.

In addition, the acyl group in the above Chemical Formulas 7 and 8 is a functional group represented by RC=O, where the R represents an alkyl group or an aryl group, and for example, includes formyl, acetyl, propionyl, or benzoyl, but the present application is not limited thereto. The carbon number of the alkyl group and aryl group included in the acyl group are the same as described above.

In one example, in the above Chemical Formula 8, at least one or more of the $R^{25}$ and $R^{26}$ may be a reactive functional group that can be hydrolyzed by the approach of water in a system, and the explanation thereof is the same as that of the reactive functional group described above, and thus, will not be provided.

In addition, the $R^{25}$ and $R^{26}$ may be an unreactive functional group, and the explanation thereof is the same as that of the unreactive functional group described above, and thus, will not be provided.

In the above Chemical Formula 8, $R^{27}$ is a functional group that includes the moiety having the converted hydroxyl group described above and the moiety having an amine functional group together, and for this reason, the copolymer of the present application includes a hydrogen bond, which is formed between the amine functional group and hydroxyl group on the surface of the glass substrate at the lower part of the encapsulant in an optoelectronic device as described above, and thereby may provide more excellent adhesion strength, and also, includes many hydrogen bonds on the back sheet composed of a fluorine resin at the upper part of the encapsulant, and thereby may provide excellent adhesion strength.

In one example, preferably, $R^{25}$ and $R^{26}$ in the above Chemical Formula 8 each independently may represent a hydroxyl group or $-R^{28}R^{29}$, which is bound to a silicon atom, $R^{28}$ may represent oxygen, $R^{29}$ may represent an alkyl group, $R^{27}$ may represent $-OSiR^{30}{}_cR^{31}{}_{(2-c)}R^{32}$, which is bound to a silicon atom, $R^{30}$ and $R^{31}$ each independently may represent a hydroxyl group or $-R^{33}R^{34}$, which is bound to a silicon atom, $R^{33}$ may represent oxygen, $R^{34}$ may represent an alkyl group, $R^{32}$ may represent $-(CH_2)_d NR^{35}R^{36}$, which is bound to a silicon atom, $R^{35}$ and $R^{36}$ each independently may represent hydrogen or $R^{37}NH_2$, which is bound to a silicon atom, and $R^{37}$ may represent alkylene.

In addition, more preferably, in the above Chemical Formula 8, $R^{25}$ and $R^{26}$ may represent a hydroxyl group, $R^{27}$ may represent $-OSiR^{30}{}_cR^{31}{}_{(2-c)}R^{32}$, which is bound to a silicon atom, $R^{30}$ and $R^{31}$ may represent a hydroxyl group, $R^{32}$ may represent $-(CH_2)_dNR^{35}R^{36}$, which is bound to a silicon atom, $R^{35}$ may represent hydrogen, $R^{36}$ may represent $R^{37}NH_2$, and $R^{37}$ may represent alkylene.

Here, the alkyl group and alkylene are the same as described above.

As described above, when the modified olefin resin, that is, the copolymer includes the moiety having the converted hydroxyl group and also the amine functional group, the rate that converts some hydrocarbon groups on the silyl group into the hydroxyl groups may become very fast, as compared with the copolymer only including the branched chain represented by the above Chemical Formula 7, for example, the copolymer copolymerized only with an unsaturated silane compound having an vinyl group on an olefin resin, that is, the silane modified olefin resin. For this reason, when the modified olefin resin is included in the encapsulant for an optoelectronic device, as compared with the silane modified olefin resin that includes only the branched chain represented by Chemical Formula 7, a large number of the hydrogen bonds between the amine functional groups and hydroxyl groups on the surface of the glass substrate on the lower part of the encapsulant may be formed, thereby providing more excellent adhesion strength, and a large number of the hydrogen bonds with the back sheet composed of a fluorine resin on the upper part of the encapsulant may be formed, thereby providing excellent adhesion strength.

The copolymer may be used as an encapsulant for the encapsulation of elements in various optoelectronic devices, but the present application is not limited thereto. For example, the copolymer may be used as an industrial material that is applied to a temperature rising lamination process.

In one example, the encapsulant for an optoelectronic device includes the modified olefin resin prepared by performing a grafting extrusion reaction of the resin composition according to the present application, that is, the above-described copolymer. As described above, the copolymer includes the branched chains represented by the above Chemical Formulas 7 and 8, and thus, includes both of the moiety A, in which the hydrocarbon groups of some silyl groups are converted into the hydroxyl groups, and the moiety B that is introduced with the terminal amine functional groups. The ratio of the silane modified moiety A and silane modified moiety B introduced with the amine group may be 99:1 to 40:60.

The encapsulant for an optoelectronic device may include an unmodified olefin resin in addition to the modified olefin resin. A specific type of the available unmodified olefin resin is not particularly limited. For example, polyethylene may be used as the unmodified olefin resin, and in detail, an ethylene/α-olefin copolymer that falls into the same category as the ethylene/α-olefin copolymer, which is used for preparing the modified olefin resin, may be used.

The content ratio of the unmodified olefin resin and modified olefin resin may be 1:1 to 20:1. When the content of the unmodified olefin resin is too large, it is easy to decrease the adhesion performance expressed by the modified olefin resin, and when the content of the unmodified olefin resin is too small, the adhesion performance expressed by the modified olefin resin is early expressed, thereby decreasing the processability and generating gel, and thus, the sheet moldability may be not preferable.

The content of the unmodified olefin resin is not particularly limited, and may be selected in consideration of the desired physical properties. For example, the unmodified olefin resin may be included in the range of 0.01 part by weight to 3000 parts by weight, 100 parts by weight to 2000 parts by weight, or 90 parts by weight to 1000 parts by weight, with respect to 100 parts by weight of the modified olefin resin.

The encapsulant may include the respective components in a state of being uniformly mixed as it is or may include the respective components in a state of being molded by various molding methods, such as, a heat-melting extrusion and a T-die molding.

A shape of the encapsulant is not particularly limited, but for example, may be a shape of sheet or film. In this case, the thickness of the encapsulant may be controlled to be about 10 μm to 2,000 μm or about 100 μm to 1250 μm, in consideration of the efficiency of support of an element, the probability of element damage, the lightening of device weight, workability, and the like. However, the thickness of the encapsulant may be modified according to a specific applied use.

The encapsulant manufactured from the resin composition may be used in an optoelectronic device including an encapsulated optoelectronic element.

The optoelectronic element to be encapsulated may be a light emission or light sensing site of a photovoltaic cell, a light emitting diode, or an organic light emitting diode, for example.

A specific structure of the optoelectronic device or a method for encapsulating the optoelectronic element using the above-described resin composition is not particularly limited, and may be applied to obtain the purpose of a corresponding device.

For example, when the optoelectronic device is a photoelectric cell, as illustrated in FIG. 7 or 8, the optoelectronic device may be a solar cell module including front substrates 11, 21, back sheets 12, 22, and photovoltaic elements 13, 23 encapsulated by encapsulants 14*a*, 14*b*, 24 between the front substrates 11, 21 and the back sheets 12, 22, and in this case, the encapsulants may be manufactured from the resin composition according to the exemplary embodiments of the present application.

The solar cell module may be manufactured by laminating a front substrate, an encapsulant, a photovoltaic element, and a back sheet according to a desired structure, and then, by performing a general molding method, such as, a lamination method including heat-pressing while vacuum-suctioning the laminate in an integral form. In this case, the process conditions for the lamination method are not particularly limited, but in general, the lamination method may be performed at the temperature of 90° C. to 230° C. or 110° C. to 200° C. for 1 minute to 30 minutes or 1 minute to 10 minutes.

For the above-described resin composition, the hydrolysis of the reactive silyl group, for example, a methoxysilyl group (Si—O—CH$_3$) of the silane modified moiety of the modified olefin resin that is chemically unstable by passing through an extrusion process is promoted by an amino silane compound in the modulation process, such as the lamination as described above, to convert into a silanol group (Si—OH), and thus, a chemical covalent bond by a dehydration condensation with the residue, such as a hydroxyl group, on the surface of front substrate in an optoelectronic device may be formed to exhibit high adhesive strength.

Furthermore, even on the interface with a back sheet having a surface layer including a fluoropolymer that is well used lately, fluorine and a silanol group forms a hydrogen bond, and thus, high interface adhesive strength may be exhibited unlike the conventional encapsulant. In addition, by the moiety having the amine functional group introduced by a small amount of the amino silane compound, the number of fluorine-noncovalent bonding sites increases, and thus, high adhesion strength may be provided.

Here, the specific types of the available front substrate, back sheet, and photovoltaic element are not particularly limited. For example, the front substrate may be a general plate glass; or a transparent complex sheet manufactured by laminating a glass, a fluoro-based resin sheet, a weather-proof film, and a barrier film, and the back sheet may be a complex sheet manufactured by laminating a metal, such as aluminum, a fluoro-based resin sheet, a weatherproof film, and a barrier film, and includes a surface layer having a fluoropolymer. For example, the back sheet may be a multilayer film having the fluoropolymer layers on both sides of a polyethylene terephthalate (PET) film. In addition, the photovoltaic element may be, for example, an active layer of silicon wafer series or a thin-film active layer formed by a chemical vapor deposition (CVD).

Advantageous Effects

Exemplary embodiments of the present application can provide a polyolefin resin that can provide an encapsulant having high light transmittance and low haze value even under the condition of low lamination. The resin composition including the polyolefin resin is used for manufacturing an encapsulant for various optoelectronic devices, and thus, can provide excellent adhesive strength with the front substrate and the back sheet included in the above devices, and especially, can provide an encapsulant having long-term adhesion property and improved heat resistance. In addition, by exhibiting adhesion strength that is high enough even at a low temperature at the time of encapsulating an optoelectronic device, workability, economic feasibility, and the like can be excellently maintained for manufacturing a device.

MODES OF THE INVENTION

Hereinafter, the present application will be described in more detail with reference to Examples according to the present application and Comparative Examples not according to the present application, but the scope of the present application is not limited to the following Examples.

Hereinafter, the physical properties in Examples and Comparative Examples were estimated in the following way.

1. Measurement of Crystallization Temperature (Tc)

Figure 1:
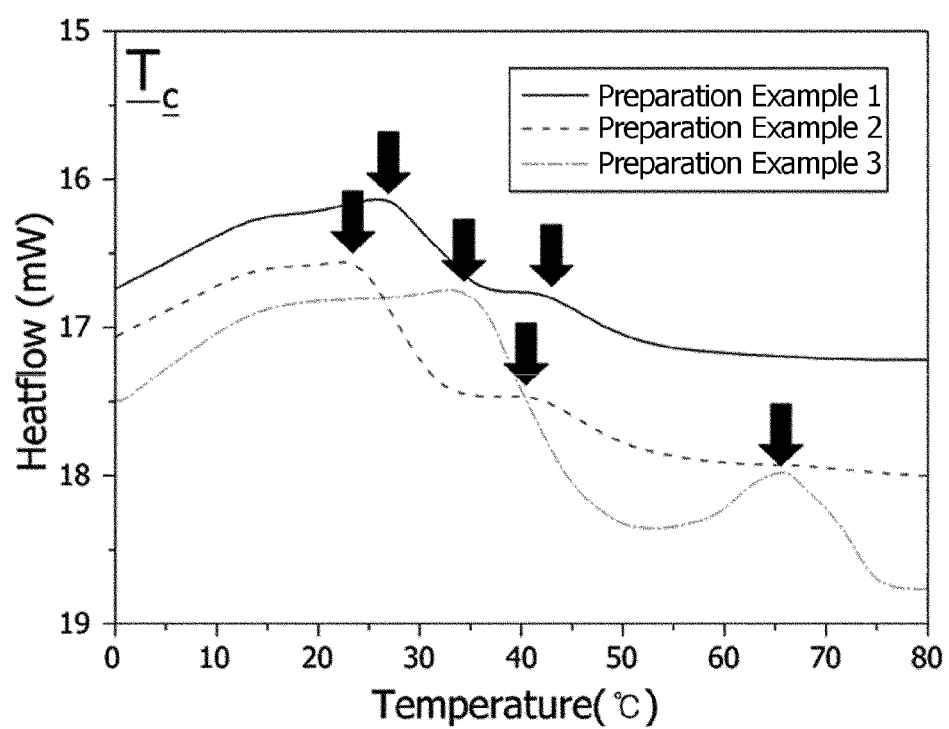
FIGS. 1 and 2 illustrate differential scanning calorimetric analysis graphs of the polyolefin resins prepared according to Preparation Examples 1 to 3 of the present application.
Figure 3:
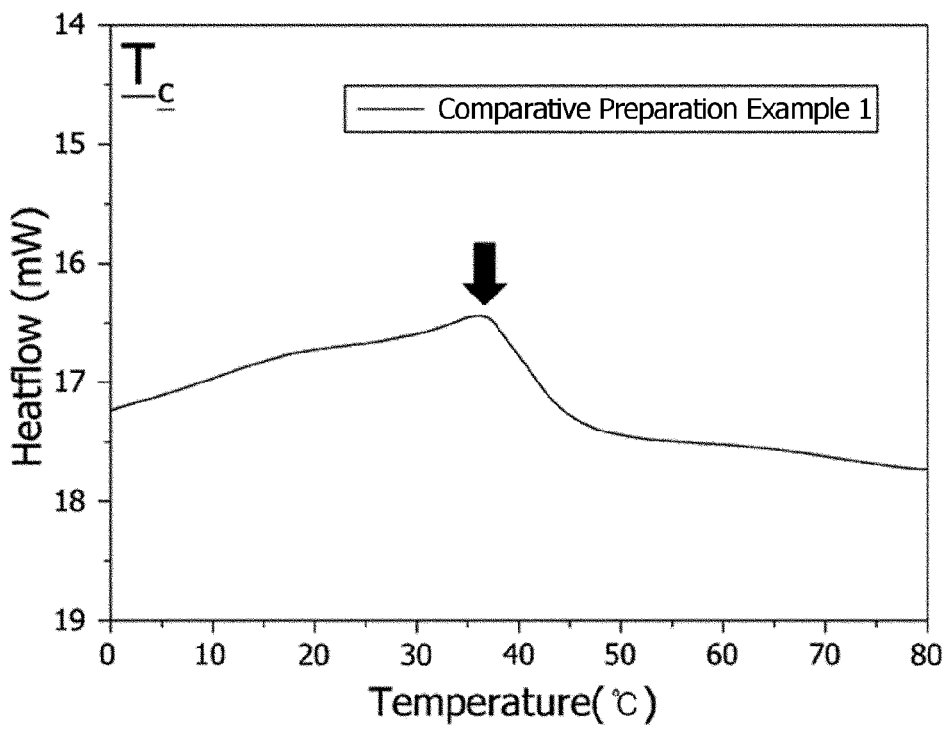
FIGS. 3 and 4 illustrate differential scanning calorimetric analysis graphs of the polyolefin resin prepared according to Comparative Preparation Example 1 of the present application.

For the polymers obtained in the following Preparation Examples 1 to 3 and Comparative Preparation Example 1, the crystallization temperatures (Tc) were confirmed through analyzing the peaks of a cooling curve of a heat flow measured by a differential scanning calorimetry (DSC) while cooling the polymers from 200° C. to −150° C. at a rate of 10° C./min. The results of analyzing the polymers of Preparation Examples 1 and 3 with a DSC are illustrated in FIG. 1 and the result of analyzing the polymer of Comparative Preparation Example 1 with a DSC is illustrated in FIG. 3.

2. Measurement of Melting Temperature (Tm)

Figure 2:
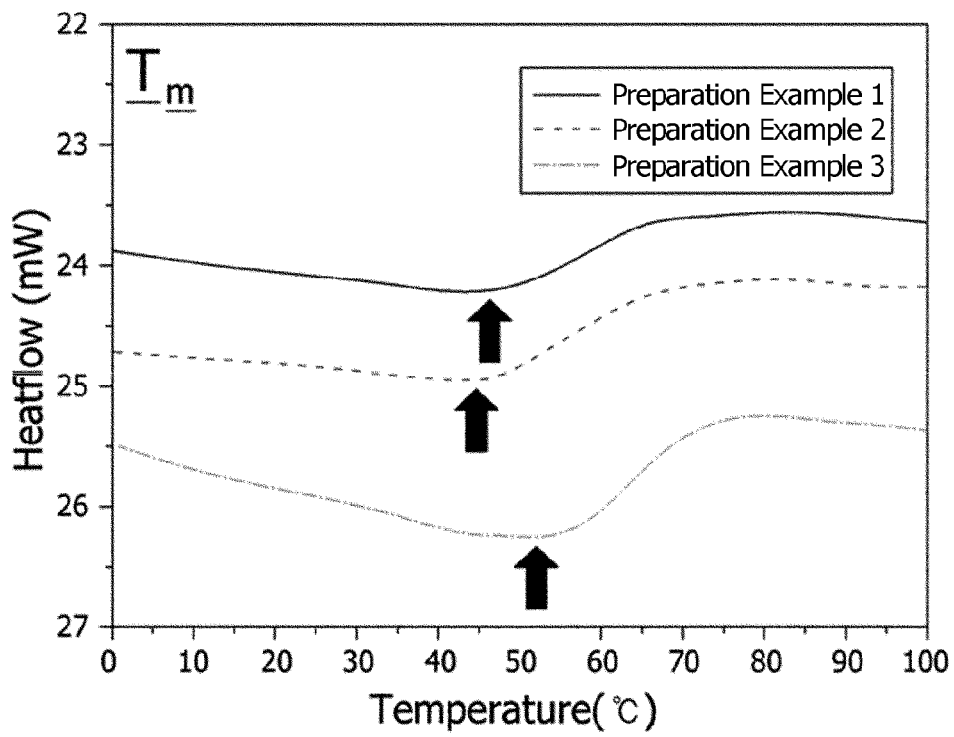
Figure 4:
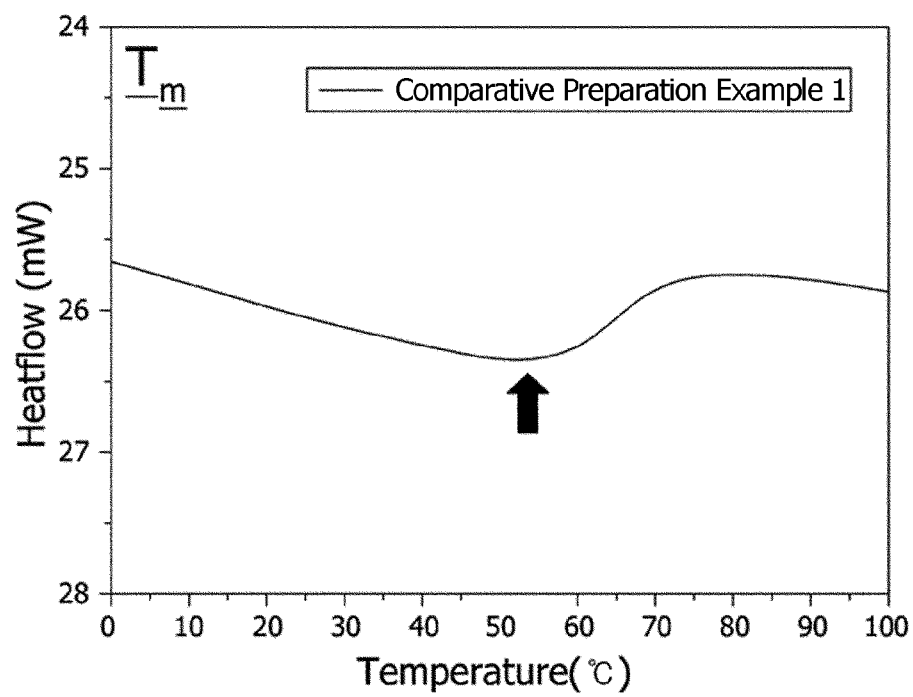

For the polymers obtained in the following Preparation Examples 1 to 3 and Comparative Preparation Example 1, after measuring the crystallization temperatures of the samples while cooling the samples from 200° C. to −150° C. at a rate of 10° C./min, the melting temperatures (Tm) were confirmed through analyzing the peaks of a heating curve of a heat flow measured with a DSC while raising the temperatures of the samples from −150° C. to 200° C. at a rate of 10° C./min. The results of analyzing the polymers of Preparation Examples 1 to 3 with a DSC are illustrated in FIG. 2 and the result of analyzing the polymer of Comparative Preparation Example 1 with a DSC is illustrated in FIG. 4.

3. Measurement of Melting Index

For the polymers obtained in the following Preparation Examples 1 to 3 and Comparative Preparation Example 1, the melting indexes were measured by measuring the weights of samples that flew out by the weight of 2.16 kg weight at the temperature of 190° C. under the condition of ASTM D-1238-04.

<Preparation of Ethylene/α-olefin Copolymer>

PREPARATION EXAMPLE 1

A hexane solvent (1.0 L) and 6.4 mmol of 1-octene were added to a 2L autoclave reactor, and then, the temperature of the reactor was pre-heated to be 120° C. The compound (0.5 μmol) represented by the following Chemical Formula 9, which was treated with a triisobutylaluminum compound (10 μmol), and a dimethylanilinium tetrakis(pentafluorophenyl) borate co-catalyst (10 μmol) were added and filled in order in a 25 mL catalyst storage tank (the mole ratio of Al:Ti was 10). Since then, ethylene pressure (35 bar) was applied inside the autoclave reactor, a catalyst composition was injected in the reactor using a high-pressure argon gas, and then, a copolymerization reaction was performed for 10 minutes. Next, after removing the remained ethylene gas, the solution of polymer was added in excess ethanol to induce precipitation. The precipitated polymer was washed with ethanol and acetone, 2 or 3 times, respectively, and then, dried in a vacuum oven of 80° C. for 12 hours or more to obtain ethylene-1-octene having a density of 0.862 g/ml.

[Chemical Formula 9]

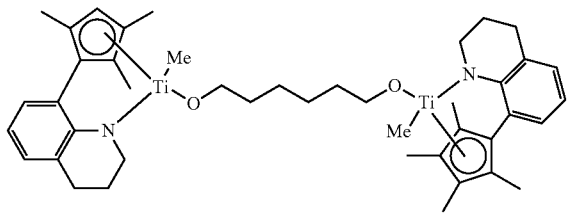

The crystallization temperature (Tc) and melting temperature (Tm) of the ethylene-1-octene resin obtained in Preparation Example 1 were measured with a DSC. The results thus obtained are listed in Table 1.

PREPARATION EXAMPLE 2

The ethylene-1-octene having a density of 0.859 g/ml was obtained by the same method as Preparation Example 1.

The crystallization temperature (Tc) and melting temperature (Tm) of the ethylene-1-octene resin obtained in Preparation Example 2 were measured with a DSC. The results thus obtained are listed in Table 1.

PREPARATION EXAMPLE 3

The ethylene-1-octene having a density of 0.869 g/ml was obtained by the same method as Preparation Example 1.

The crystallization temperature (Tc) and melting temperature (Tm) of the ethylene-1-octene resin obtained in Preparation Example 3 were measured with a DSC. The results thus obtained are listed in Table 1.

COMPARATIVE PREPARATION EXAMPLE 1

The ethylene-1-octene polymer having a density of 0.866 g/ml was obtained by the same method as Preparation Example 1, except that 0.5 μmol of the compound represented by the following Chemical Formula 10 was used instead of a dinuclear catalyst.

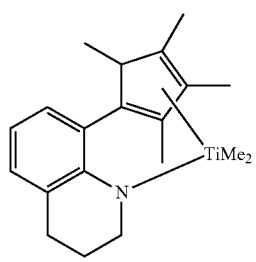

[Chemical Formula 10]

The crystallization temperature (Tc) and melting temperature (Tm) of the ethylene-1-octene resin obtained in Comparative Preparation Example 1 were measured with a DSC. The results thus obtained are listed in Table 1.

TABLE 1

| | First crystallization temperature ($Tc^1$) | Second crystallization temperature ($Tc^2$) | Tm (° C.) | $|Tc^2 - Tc^1| - |Tm - Tc^2|$ (° C.) |
|---|---|---|---|---|
| Pre. Ex. 1 | 27 | 43 | 44 | 15 |
| Pre. Ex. 2 | 24 | 41 | 42 | 16 |
| Pre. Ex. 3 | 33 | 66 | 51 | 18 |
| Com. Pre. Ex. 1 | 36 | — | 53 | — |

<Preparation of Modified Ethylene/α-olefin Copolymer>

PREPARATION EXAMPLE 4

95.01 parts by weight of the ethylene/α-olefin copolymer having a density of 0.862 g/cm³ and an MFR of 1.12 g/10 min under the load of 2.16 kg and 190° C., which was prepared in Preparation Example 1, 4.79 parts by weight of vinyltrimethoxysilane (VTMS), 0.1 part by weight of 3-aminopropyltrimethoxysilane (APTMS), and 0.1 part by weight of 2,5-Bis(tert-butylperoxy)-2,5-dimethylhexane (Luperox 101) were subjected to a grafting reaction extrusion (heat-melting stirring) at the temperature of 220° C. using a twin-screw extruder to prepare a master batch of modified ethylene/α-olefin copolymer (part by weight refers to wt % with respect to 100 parts by weight of the total amount).

PREPARATION EXAMPLE 5

A master batch of modified ethylene/α-olefin copolymer was prepared by performing the same method as Preparation Example 4, except that the ethylene/α-olefin copolymer having a density of 0.859 g/cm³ and an MFR of 0.68 g/10 min under the load of 2.16 kg and 190° C., which was prepared in Preparation Example 2, was used instead of the ethylene/α-olefin copolymer prepared in Preparation Example 1.

PREPARATION EXAMPLE 6

A master batch of modified ethylene/α-olefin copolymer was prepared by performing the same method as Preparation Example 4, except that the ethylene/α-olefin copolymer having a density of 0.869 g/cm³ and an MFR of 4.2 g/10 min under the load of 2.16 kg and 190° C., which was prepared in Preparation Example 3, was used instead of the ethylene/α-olefin copolymer prepared in Preparation Example 1.

PREPARATION EXAMPLE 7

A master batch of modified ethylene/α-olefin copolymer was prepared by performing the same method as Preparation Example 6, except that 4.89 parts by weight of vinyltrimethoxysilane and 0.1 part by weight of 2,5-Bis(tert-butylperoxy)-2,5-dimethylhexane were used instead of 4.79 parts by weight of vinyltrimethoxysilane, 0.1 part by weight of 3-aminopropyltrimethoxysilane, and 0.1 part by weight of 2,5-Bis(tert-butylperoxy)-2,5-dimethylhexane, which were used in Preparation Example 6.

PREPARATION EXAMPLE 8

A master batch of modified ethylene/α-olefin copolymer was prepared by performing the same method as Preparation Example 6, except that 0.1 part by weight of 3-aminopropyltriethoxysilane was used instead of 0.1 part by weight of 3-aminopropyltrimethoxysilane, which was used in Preparation Example 6.

COMPARATIVE PREPARATION EXAMPLE 2

A master batch of modified ethylene/α-olefin copolymer was prepared by performing the same method as Preparation Example 4, except that the ethylene/α-olefin copolymer having a density of 0.866 g/cm³ and an MFR of 1.27 g/10 min under the load of 2.16 kg and 190° C., which was prepared in Comparative Preparation Example 1, was used instead of the ethylene/α-olefin copolymer prepared in Preparation Example 1.

<Preparation of Encapsulant and Photovoltaic Module>

EXAMPLE 1

To the resin prepared by mixing 200 g of the master batch of the modified ethylene/α-olefin copolymer prepared in Preparation Example 4 and 400 g of the ethylene/α-olefin copolymer prepared in Preparation Example 1 in the ratio of 1:2, 18 g of the master batch of additives was added so as to include 3000 ppm of a light stabilizer (Songlight 7700), 1000 ppm of an UV absorbent (TINUVIN UV531), 500 ppm of an antioxidant 1 (Irganox1010), and 500 ppm of an antioxidant 2 (Irgafos168) in a final sheet. Next, the mixture thus obtained was added in a hopper of a film molder having a twin-screw extruder (φ19 mm) and T-die (width: 200 mm)

and was processed at an extrusion temperature of 180° C. and an extraction rate of 3 m/min to prepare an encapsulant having a thickness of about 500 μm in a shape of sheet.

A plate glass (thickness: about 8 mm), the encapsulant having the thickness of 500 μm prepared as described above, crystal-based silicon wafer photovoltaic element, the encapsulant having the thickness of 500 μm prepared as described above, and a back sheet (the sheet prepared by laminating a polyvinyl fluoride resin sheet having a thickness of 20 μm, polyethyleneterephthalate having a thickness of 250 μm, and a polyvinyl fluoride resin sheet having the thickness of 20 μm; PVDF/PET/PVDF) were laminated in order, and then, pressed in a vacuum laminator at 110° C. for 15 minutes and 30 seconds to manufacture a photovoltaic module.

EXAMPLE 2

An encapsulant in a shape of sheet and a photovoltaic module were manufactured by the same method as Example 1, except that the master batch of the modified ethylene/α-olefin copolymer prepared in Preparation Example 5 and the ethylene/α-olefin copolymer prepared in Preparation Example 2 were used instead of the modified ethylene/α-olefin copolymer prepared in Preparation Example 4 and the ethylene/α-olefin copolymer prepared in Preparation Example 1, respectively.

EXAMPLE 3

An encapsulant in a shape of sheet and a photovoltaic module were manufactured by the same method as Example 1, except that the master batch of the modified ethylene/α-olefin copolymer prepared in Preparation Example 6 and the ethylene/α-olefin copolymer prepared in Preparation Example 3 were used instead of the modified ethylene/α-olefin copolymer prepared in Preparation Example 4 and the ethylene/α-olefin copolymer prepared in Preparation Example 1, respectively.

EXAMPLE 4

An encapsulant in a shape of sheet and a photovoltaic module were manufactured by the same method as Example 3, except that the master batch of the modified ethylene/α-olefin copolymer prepared in Preparation Example 7 was used instead of the modified ethylene/α-olefin copolymer prepared in Preparation Example 6.

EXAMPLE 5

An encapsulant in a shape of sheet and a photovoltaic module were manufactured by the same method as Example 3, except that the master batch of the modified ethylene/α-olefin copolymer prepared in Preparation Example 8 was used instead of the modified ethylene/α-olefin copolymer prepared in Preparation Example 6.

EXAMPLES 6 to 10

The photovoltaic modules were manufactured by the same methods as Examples 1 to 5, respectively, except that each of them was pressed in a vacuum laminator at 150° C. for 15 minutes and 30 seconds.

COMPARATIVE EXAMPLE 1

An encapsulant in a shape of sheet and a photovoltaic module were manufactured by the same method as Example 1, except that the master batch of the modified ethylene/α-olefin copolymer prepared in Comparative Preparation Example 2 and the ethylene/α-olefin copolymer prepared in Comparative Preparation Example 1 were used instead of the modified ethylene/α-olefin copolymer prepared in Preparation Example 1 and the ethylene/α-olefin copolymer prepared in Preparation Example 1, respectively.

COMPARATIVE EXAMPLE 2

The photovoltaic module was manufactured by the same method as Comparative Example 1, except that it was pressed in a vacuum laminator at 150° C. for 15 minutes and 30 seconds.

EXPERIMENTAL EXAMPLE

1. Measurement of 90° Peeling Strength

The specimens that were similar as the prepared photovoltaic modules were separately prepared so as to measure the peeling strengths of the encapsulants manufactured in Examples 1 to 3, 5 and 10, and Comparative Example 1. The specimens were prepared by laminating a plate glass (thickness: about 8 mm), the encapsulant having the thickness of 500 μm prepared as described above, and a back sheet (the sheet prepared by laminating a polyvinyl fluoride resin sheet having the thickness of 20 μm, polyethyleneterephthalate having the thickness of 250 μm, and a polyvinyl fluoride resin sheet having the thickness of 20 μm; PVDF/PET/PVDF) in order, and then, pressing in a vacuum laminator for 15 minutes at the temperatures that vary as the conditions listed in Table 2. After fixing the lower glass plate of the prepared specimen, based on ASTM D1897, the peeling strength was measured while peeling the encapsulant bonded only on the back sheet in a 15 mm c-width rectangle at a tensile rate of 50 mm/min and peeling angle of 90° along with the back sheet. The results thus obtained are listed in the following Table 2.

TABLE 2

| | Modified master batch | | | | | | |
|---|---|---|---|---|---|---|---|
| | Base resin (Content, density) | Content | VTMS (wt %) | Amino silane | Content of amino silane (with respect to total silane) | Lamination Temperature (° C.) | 90° peeling strength (N/15 mm) |
| Ex. 1 | 400 g (d = 0.862) | 200 g | 4.79 wt % | APTMS 0.1 wt % | 2 wt % | 110 | 100 |
| Ex. 2 | 400 g (d = 0.859) | 200 g | 4.79 wt % | APTMS 0.1 wt % | 2 wt % | 110 | 95 |
| Ex. 3 | 400 g (d = 0.869) | 200 g | 4.79 wt % | APTMS 0.1 wt % | 2 wt % | 110 | 105 |

TABLE 2-continued

| | Modified master batch | | | | | | |
|---|---|---|---|---|---|---|---|
| | Base resin (Content, density) | Content | VTMS (wt %) | Amino silane (wt %) | Content of amino silane (with respect to total silane) | Lamination Temperature (° C.) | 90° peeling strength (N/15 mm) |
| Ex. 5 | 400 g (d = 0.869) | 200 g | 4.79 wt % | APTES 0.1 wt % | 2 wt % | 110 | 100 |
| Ex. 10 | 400 g (d = 0.869) | 200 g | 4.79 wt % | APTES 0.1 wt % | 2 wt % | 150 | 185 |
| Com. Ex. 1 | 400 g (d = 0.866) | 200 g | 4.79 wt % | APTMS 0.1 wt % | 2 wt % | 110 | 100 |

Figure 5:
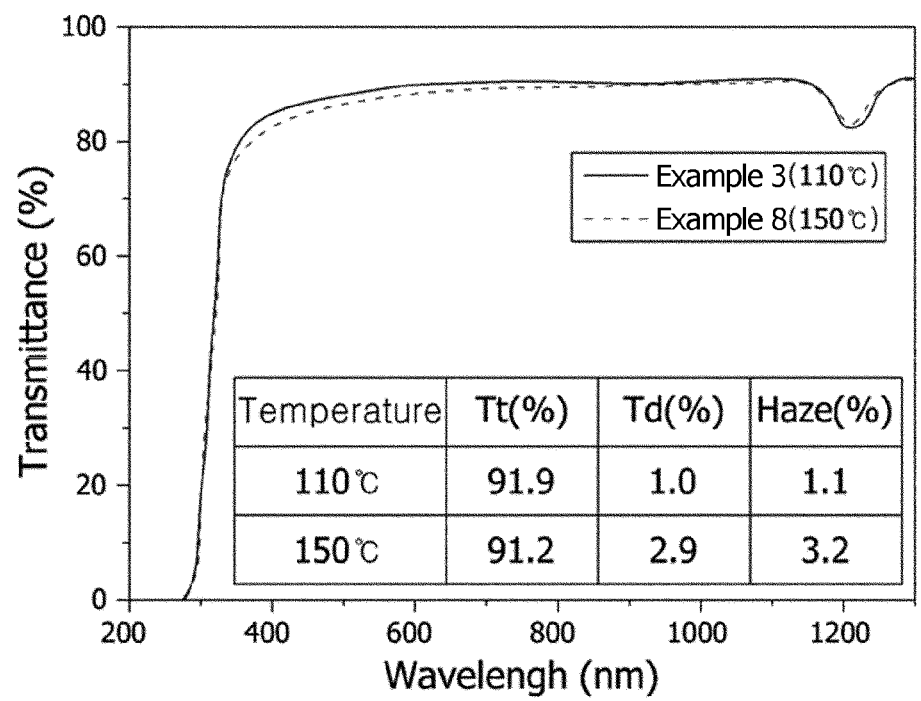
FIG. 5 illustrates a graph illustrating a UV/Vis spectroscopy of the samples prepared in Examples 3 and 8 of the present application according to Experimental Example 2.
Figure 6:
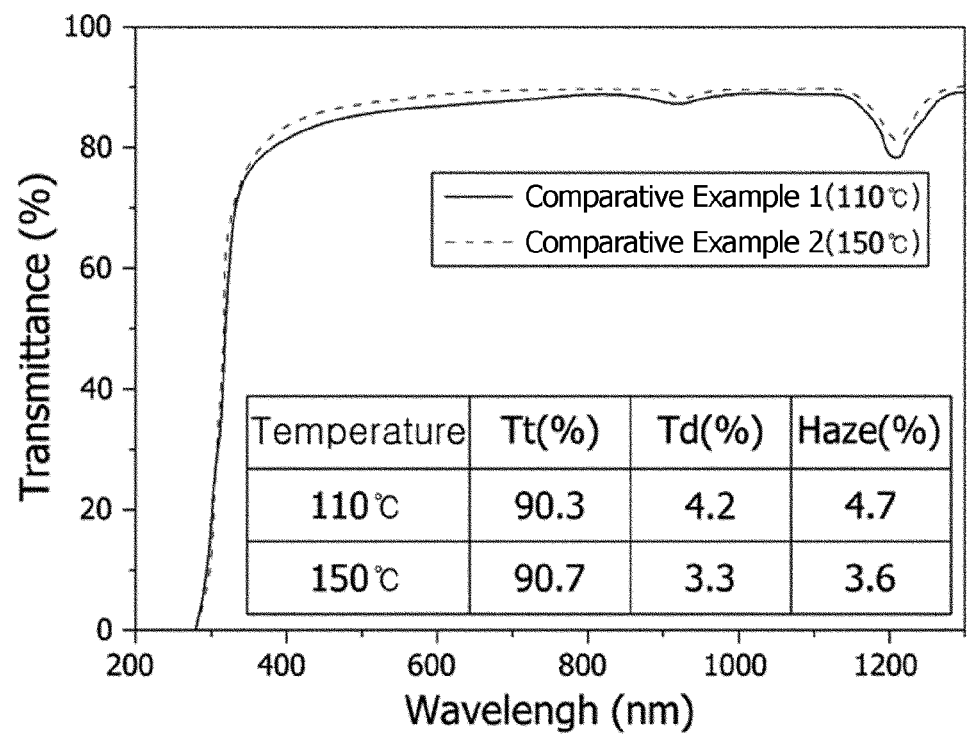
FIG. 6 illustrates a graph illustrating a UV/Vis spectroscopy of the samples prepared in Comparative Examples 1 and 2 of the present application according to Experimental Example 2.
Figure 7:
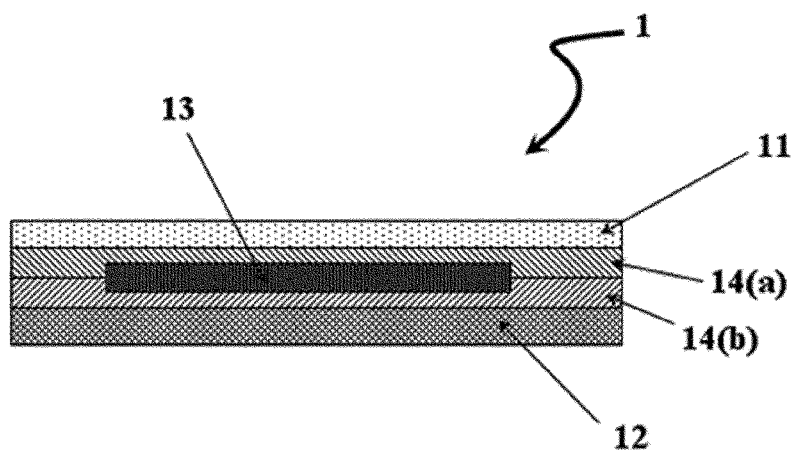
FIGS. 7 and 8 illustrate cross-sectional diagrams that exemplarily illustrate solar cell modules as optoelectronic devices according to one exemplary embodiment of the present application.
Figure 8:
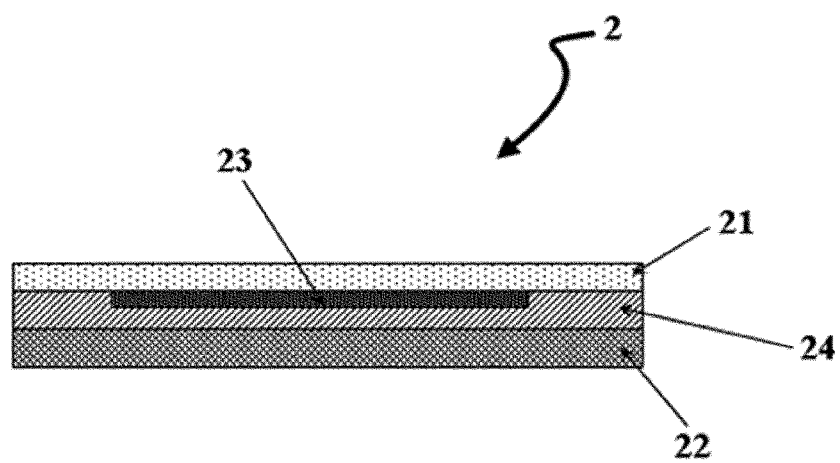

VTMS: Vinyltrimethoxysilane
APTMS: 3-aminopropyltrimethoxysilane
APTES: 3-aminopropyltriethoxysilane 2. Measurement of Light Transmittance And Haze The specimens were separately prepared so as to measure light transmittances and hazes of the encapsulants in Examples 3 to 5 and 8 to 10, and Comparative Examples 1 and 2. The specimens were prepared by inserting two overlapped encapsulants having the thickness of 500 μm prepared as described above between two plate glasses (thickness: about 1 mm), and then, by laminating them in a vacuum laminator under the temperatures that vary as the conditions listed in the following Table 3. The specimens were prepared to have about 500 ±50 μm of the sum of the thicknesses of the overlapped encapsulants sheets, constantly, using a guide, and then, the total light transmittance and haze value to the light at the wavelength of 550 nm were measured with a haze meter. The results thus obtained are listed in the following Table 3. In this case, the specimens were put in a specimen holder, and then the transmittance and haze value were measured three times, and then, their average values were obtained. The values were measured under the standard of JIS K 7105. In addition, the total light transmittance to the light at the wavelength of 200 to 1300 nm was measured using an UV/Vis spectroscopy. The results thus obtained are illustrated in FIGS. 5 and 6. The lamination process time was set to 5 min vacuum/3 sec press/10 min retain pressure.

<Measurement Conditions of UV/Vis Spectroscopy Device>

Slit width: 32 nm
Detector unit: External (2D detectors)
Time constant: 0.2 sec

TABLE 3

| | Lamination condition | 5 min vacuum/30 sec press/10 min retain pressure | | |
|---|---|---|---|---|
| | Temperature | Tt (%) | Td (%) | Haze (%) |
| Ex. 3 | 110° C. | 91.9 | 1.0 | 1.1 |
| Ex. 4 | 110° C. | 91.9 | 0.9 | 1.0 |
| Ex. 5 | 110° C. | 91.8 | 0.9 | 1.0 |
| Ex. 8 | 150° C. | 91.2 | 2.9 | 3.2 |
| Ex. 9 | 150° C. | 91.3 | 3.0 | 3.3 |
| Ex. 10 | 150° C. | 91.3 | 3.0 | 3.3 |
| Com. Ex. 1 | 110° C. | 90.3 | 4.2 | 4.7 |
| Com. Ex. 2 | 150° C. | 90.7 | 3.3 | 3.6 |

As can be confirmed in the above Table 3 and FIG. 5, the lamination sample exhibits low haze and high total light transmittance at a low temperature, that is, 110° C.

In other words, from Examples 1 to 8, Comparative Examples 1 and 2, and Experimental Examples thereabout, it can be confirmed that the encapsulant for an optoelectronic device, which is manufactured using the resin composition including the polyolefin resin having two crystallization temperatures, exhibits high adhesion strength, high total light transmittance, and low haze value even at a low temperature during the modulation process. Therefore, it can be confirmed that it is possible to laminate at a low temperature as compared with the conventional process, and thus, the light transmittance and production efficiency of the encapsulant sheet can be improved.

The invention claimed is:

1. A polyolefin resin for an encapsulant for an optoelectronic device, having a first crystallization temperature of 20° C. to 35° C. and a second crystallization temperature that is higher than the first crystallization temperature and one melting temperature, wherein the polyolefin resin satisfies the following Equation 1:

$$10° \text{C.} \leq |Tc^2 - Tc^1| - |Tm - Tc^2| \qquad \text{Equation 1}$$

where, in Equation 1,
Tc$^1$ represents the first crystallization temperature,
Tc$^2$ represents the second crystallization temperature, and
Tm represents the melting temperature.

2. The polyolefin resin of claim 1, wherein a difference between the first crystallization temperature and the second crystallization temperature of the polyolefin resin is 10° C. or higher.

3. The polyolefin resin of claim 1, wherein a difference between the first crystallization temperature and the second crystallization temperature of the polyolefin resin is 15° C. or higher.

4. The polyolefin resin of claim 1, wherein the first crystallization temperature of the polyolefin resin is 24° C. to 34° C. and the second crystallization temperature of the polyolefin resin is 40° C. to 70° C.

5. The polyolefin resin of claim 1, wherein the melting temperature is 40° C. to 60° C.

6. The polyolefin resin of claim 1, wherein the polyolefin resin satisfies the following Equation 7:

$$|Tc^2 - Tc^1| - |Tm - Tc^2| \leq 20° \text{C.} \qquad \text{Equation 7}$$

where, in Equation 7,
Tc$^1$ represents the first crystallization temperature,
Tc$^2$ represents the second crystallization temperature, and
Tm represents the melting temperature.

7. The polyolefin resin of claim 1, wherein the polyolefin resin is a copolymer of one or more monomers selected from the group consisting of ethylene, propylene, and α-olefin-based monomers.

8. The polyolefin resin of claim 1, wherein the polyolefin resin is a copolymer of ethylene and a-olefin-based monomers or a copolymer of propylene and α-olefin-based monomers.

9. The polyolefin resin of claim 7, wherein the copolymer is a random copolymer.

10. A resin composition for an encapsulant, comprising the polyolefin resin according to claim 1.

11. The resin composition of claim 10, further comprising an unsaturated silane compound and a radical initiator.

12. The resin composition of claim 11, wherein the unsaturated silane compound is a compound represented by the following Chemical Formula 5:

$$DSiR^{10}_pR^{11}_{(3-p)}$$ [Chemical Formula 5]

where, in Chemical Formula 5, D represents alkenyl that is bound to a silicon atom,
$R^{10}$ represents a hydroxyl group, halogen, an amine group, or $-R^{12}R^{13}$, which is bound to a silicon atom,
$R^{12}$ represents an oxygen or sulfur atom,
$R^{13}$ represents an alkyl group, an aryl group, or an acyl group,
$R^{11}$ represents hydrogen, an alkyl group, an aryl group, or an aralkyl group, which is bound to a silicon atom, and
p represents an integer of 1 to 3.

13. The resin composition of claim 11, further comprising an amino silane compound.

14. The resin composition of claim 13, wherein the amino silane compound is a compound represented by the following Chemical Formula 6:

$$SiR^{14}_qR^{15}_{(4-q)}$$ [Chemical Formula 6]

where, in Chemical Formula 6,
$R^{14}$ represents $-(CH_2)_rNR^{16}R^{17}$ which is bound to a silicon atom,
$R^{16}$ and $R^{17}$ each independently represent hydrogen or $R^{18}NH_2$, which is bound to a nitrogen atom,
$R^{18}$ represents alkylene,
$R^{15}$ represents halogen, an amine group, $-R^{19}R^{20}$, or $-R^{20}$, which is bound to a silicon atom,
$R^{19}$ represents an oxygen or sulfur atom,
$R^{20}$ represents hydrogen, an alkyl group, an aryl group, an aralkyl group, or an acyl group,
q represents an integer of 1 to 4, and
r represents an integer of 0 or more.

15. A method for manufacturing an encapsulant for an optoelectronic device, comprising preparing a modified olefin resin through performing an extrusion reaction of the resin composition according to claim 10.

16. The method of claim 15, further comprising further adding an unmodified olefin resin to the modified olefin resin and molding a mixture thus obtained in a shape of film or sheet.

17. An encapsulant film comprising a reaction extrusion product of the resin composition including the polyolefin resin according to claim 1 and satisfying the following Equation 2:

$$T_t \geq 91.0\%$$ [Equation 2]

where, in Equation 2, $T_t$ represents total light transmittance measured with a haze meter after laminating the encapsulant film on a glass substrate at a temperature of 110° C.

18. The encapsulant film of claim 17, satisfying the following Equation 3:

$$H_z \leq 4.6\%$$ [Equation 3]

where, in Equation 3, $H_z$ represents a haze measured with a haze meter after laminating the encapsulant film on a glass substrate at a temperature of 110° C.

19. An optoelectronic device comprising a front substrate, the encapsulant film for an optoelectronic device according to claim 17, an optoelectronic element, and a back sheet.

* * * * *